United States Patent
Wehner et al.

(10) Patent No.: US 11,566,321 B2
(45) Date of Patent: Jan. 31, 2023

(54) TEMPERATURE CONTROL ROLLER, TRANSPORTING ARRANGEMENT AND VACUUM ARRANGEMENT

(71) Applicant: VON ARDENNE Asset GmbH & Co. KG, Dresden (DE)

(72) Inventors: Uwe Wehner, Pirna (DE); Thomas Puensch, Dresden (DE); Richard Zahn, Grossroehrsdorf (DE); Thomas Niederhausen, Dresden (DE)

(73) Assignee: VON ARDENNE ASSET GMBH & CO. KG, Dresden (DE)

( * ) Notice: Subject to any disclaimer, the term of this patent is extended or adjusted under 35 U.S.C. 154(b) by 48 days.

(21) Appl. No.: 16/823,462

(22) Filed: Mar. 19, 2020

(65) Prior Publication Data

US 2020/0308693 A1    Oct. 1, 2020

(30) Foreign Application Priority Data

Mar. 26, 2019    (DE) ................... 10 2019 107 719.2

(51) Int. Cl.
*C23C 14/54* (2006.01)
*C23C 14/26* (2006.01)
(Continued)

(52) U.S. Cl.
CPC .......... *C23C 14/541* (2013.01); *B65H 27/00* (2013.01); *C23C 14/26* (2013.01);
(Continued)

(58) Field of Classification Search
CPC ....... C23C 14/541; C23C 14/50; C23C 14/26; C23C 14/3421; C23C 14/562;
(Continued)

(56) References Cited

U.S. PATENT DOCUMENTS 3,037,557 A    6/1962    Faeber et al.
4,202,542 A *  5/1980    Lammers ............... B65H 5/226
                                                                271/96
(Continued)

FOREIGN PATENT DOCUMENTS

CN    1459114 A    11/2003
CN    206264226 U    6/2017
(Continued)

OTHER PUBLICATIONS

German Search Report issued for corresponding German Application No. 10 2019 107 719.2, dated Nov. 25, 2019, 9 pages (for informational purpose only).
(Continued)

*Primary Examiner* — Charlee J. C. Bennett
(74) *Attorney, Agent, or Firm* — Viering, Jentschura & Partner

(57) ABSTRACT

According to various embodiments, the temperature control roller may comprise: a cylindrical roller shell, which has a multiplicity of gas outlet openings; a temperature control device, which is configured to supply and/or extract thermal energy to or from the cylindrical roller shell; multiple gas lines made to extend along the axis of rotation; a gas distributing structure, which couples the multiple gas lines and the multiplicity of gas outlet openings to one another in a gas-conducting manner, the gas distributing structure having a lower structure density than the multiplicity of gas outlet openings.

20 Claims, 18 Drawing Sheets

(51) Int. Cl.
*C23C 14/50* (2006.01)
*B65H 27/00* (2006.01)
*C23C 14/34* (2006.01)
*C23C 14/56* (2006.01)

(52) U.S. Cl.
CPC .......... *C23C 14/3421* (2013.01); *C23C 14/50* (2013.01); *C23C 14/562* (2013.01); *B65H 2301/5114* (2013.01); *B65H 2301/5143* (2013.01); *B65H 2301/5144* (2013.01)

(58) Field of Classification Search
CPC ............ B65H 27/00; B65H 2301/5114; B65H 2301/5143; B65H 2301/5144
USPC ................................................. 118/715–733
See application file for complete search history.

(56) References Cited

U.S. PATENT DOCUMENTS

| | | | | |
|---|---|---|---|---|
| 4,207,998 A * | 6/1980 | Schmid | ................. | B65H 20/12 226/193 |
| 4,593,480 A * | 6/1986 | Mair | ...................... | B65H 27/00 399/361 |
| 4,803,877 A * | 2/1989 | Yano | ...................... | B65H 20/02 100/168 |
| 4,998,658 A * | 3/1991 | Distefano | .............. | B65H 27/00 226/95 |
| 5,076,203 A * | 12/1991 | Vaidya | ................. | C23C 14/562 118/724 |
| 5,114,062 A * | 5/1992 | Kuhn | ..................... | B65H 18/20 242/542.4 |
| 5,292,298 A * | 3/1994 | Scannell | .............. | D21G 1/0266 492/46 |
| 5,350,598 A * | 9/1994 | Kleyer | ................. | C23C 14/562 427/259 |
| 7,654,427 B1 * | 2/2010 | Tsai | ....................... | B65H 20/12 242/615.11 |
| 2003/0079983 A1 * | 5/2003 | Long | ................. | H01J 37/32082 422/186.04 |
| 2004/0074443 A1 * | 4/2004 | Madocks | .............. | C23C 14/562 118/718 |
| 2007/0134426 A1 * | 6/2007 | Hayashi | ................. | C23C 14/562 427/591 |
| 2009/0243207 A1 * | 10/2009 | Fukui | ..................... | B65H 27/00 271/264 |
| 2010/0266766 A1 * | 10/2010 | Hein | ..................... | C23C 16/545 118/729 |
| 2010/0291308 A1 | 11/2010 | Sferlazzo et al. | | |
| 2012/0006520 A1 | 1/2012 | Sferlazzo et al. | | |
| 2012/0301615 A1 * | 11/2012 | Honda | .................. | C23C 14/564 118/724 |
| 2014/0057448 A1 | 2/2014 | Okazaki et al. | | |
| 2016/0377328 A1 * | 12/2016 | Hurbi | ....................... | C09K 5/10 62/3.1 |
| 2017/0259466 A1 * | 9/2017 | Domeniconi | ........ | D21G 1/0266 |

FOREIGN PATENT DOCUMENTS

| | | |
|---|---|---|
| EP | 0311302 A1 | 4/1989 |
| GB | 2326647 A | 12/1998 |
| JP | H02225252 A | 9/1990 |
| TW | M256375 U | 2/2005 |
| WO | 0223557 A1 | 3/2002 |
| WO | 2017207053 A1 | 12/2017 |

OTHER PUBLICATIONS

European Search Report issued for corresponding European patent application 20 154 576.1 dated Aug. 21, 2020, 8 pages (for informational purpose only).

Chinese search report issued for the corresponding CN patent application No. 2020102140420, dated Jun. 28, 2021, 2 pages (for informational purposes only).

The Second Office Action issued for the corresponding CN patent application No. 202010214042.0, dated Apr. 1, 2022, 8 pages (for informational purposes only).

* cited by examiner

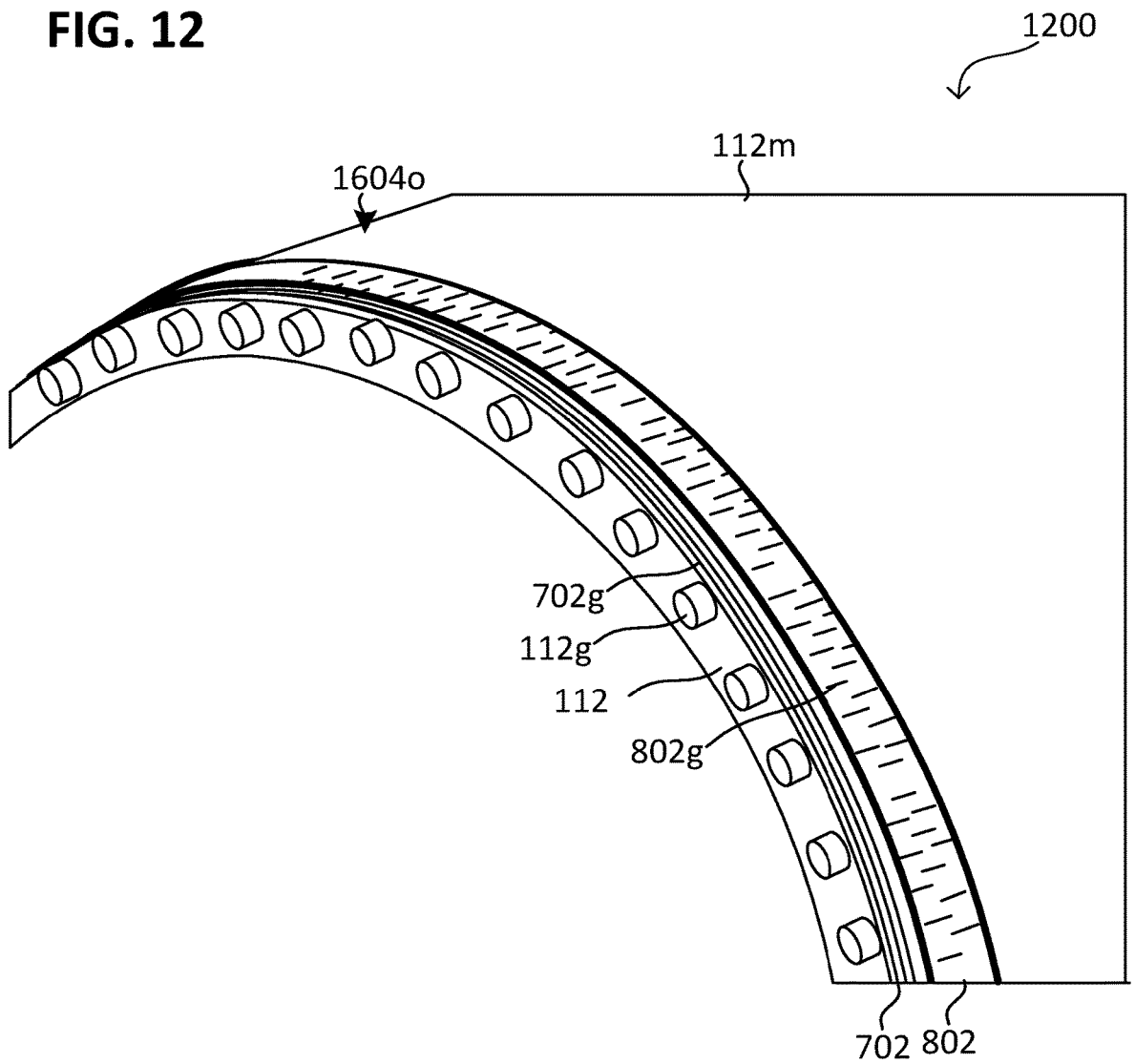

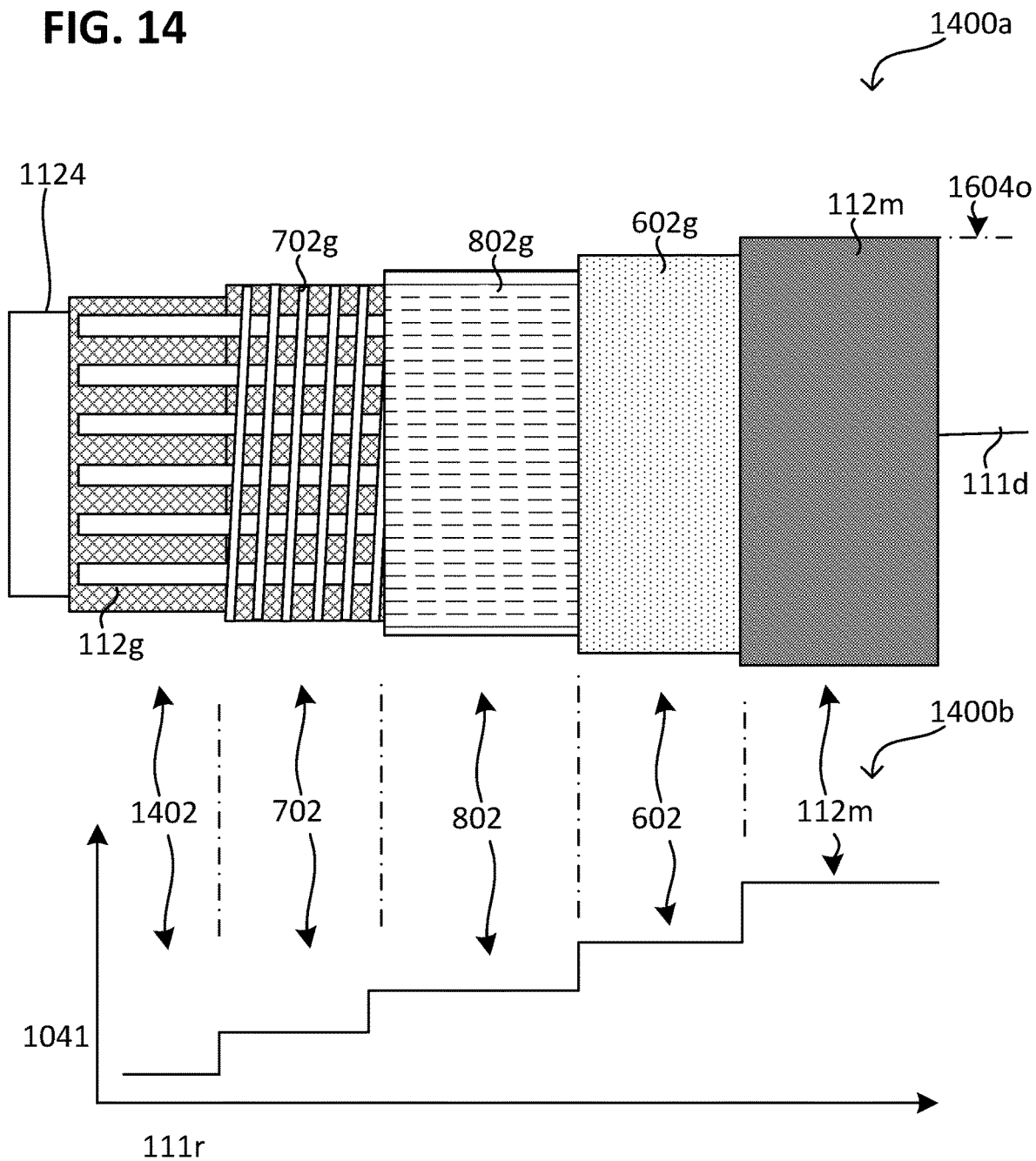

TEMPERATURE CONTROL ROLLER, TRANSPORTING ARRANGEMENT AND VACUUM ARRANGEMENT

CROSS-CITING TO RELATED APPLICATIONS

The present application claims priority to German Application 10 2019 107 719.2, which was filed Mar. 26, 2019, which is fully incorporated herein by reference.

TECHNICAL FIELD

The disclosure relates to a temperature control roller, a transporting arrangement, and a vacuum arrangement.

BACKGROUND

Generally, a substrate may be treated (processed), for example coated, in such a way that the chemical and/or physical properties of the substrate may be changed. For coating a substrate, various coating processes may be carried out, such as for example vapor deposition, for example chemical vapor deposition (CVD) or physical vapor deposition (PVD).

Generally, flexible substrates in the form of a strip (for example metal strip, film strip or glass strip) may be processed (and/or otherwise treated) in a continuous installation, for example coated in a film coating installation. In this case, a strip substrate may for example be transported through a processing region by means of a transporting arrangement. The transporting arrangement may for example be set up in such a way that the strip substrate is processed from roller to roller (also referred to as R2R), the strip substrate being unwound from a first substrate roll, transported through the coating region, and after the coating wound up again onto a second substrate roll (also referred to as circulatory winding). In this case, the coating installation may have a vacuum chamber, so that the strip substrate may be processed in a vacuum. The substrate roll may for example be fed into the vacuum chamber or removed from it, so that air must be cyclically admitted to the vacuum chamber to change over the strip substrate.

For some transporting devices it may be necessary that their transporting roller provides particularly great thermal contact with the substrate, in order to heat and/or cool the latter (more generally also referred to as temperature control). The thermal contact may be improved for example by introducing between the substrate and the transporting roller a gas that makes up for the absent thermal conductivity of the vacuum. By way of illustration, the gas fills remaining cavities between the substrate and the transporting roller and, by multiple reciprocal contact of the gas particles (for example gas molecules), improves the heat transfer between them.

SUMMARY

According to various embodiments, it has by way of illustration been recognized that the heat transfer requires a sensitive equilibrium. On the one hand, the gas should flow out of the transporting roller (for example roller surface) uniformly in an amount that also fills the cavities. On the other hand, the amount of gas should be dimensioned such that there is no lifting off of the substrate from the transporting roller (for example roller surface).

According to various embodiments, a temperature-controlling transporting roller (also referred to as temperature control roller) and a vacuum arrangement, which make it possible to control the temperature of a substrate effectively during the coating process, are provided.

By way of illustration, the temperature control roller has a gas distributing structure, which distributes the gas more effectively over the surface of the transporting roller.

According to various embodiments, a temperature control roller may have: a cylindrical roller shell, which has a multiplicity of gas outlet openings; a temperature control device (for example cooling device), which is configured to supply and/or extract thermal energy to or from the cylindrical roller shell; multiple gas lines made to extend along the axis of rotation; a gas distributing structure, which couples the multiple gas lines and the multiplicity of gas outlet openings to one another in a gas-conducting manner, the gas distributing structure having a lower structure density than the multiplicity of gas outlet openings.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiment. In the following description, various embodiments are described with reference to the following drawings, in which:

FIGS. 1, 2, 3, 10, 11, and 12 respectively show a transporting arrangement according to various embodiments in various views;

FIGS. 4, 6, 7, 8, 9, 13A, 13B, 13C, 14 and 15 respectively show a temperature control roller according to various embodiments in various views;

DETAILED DESCRIPTION

Figure 1:
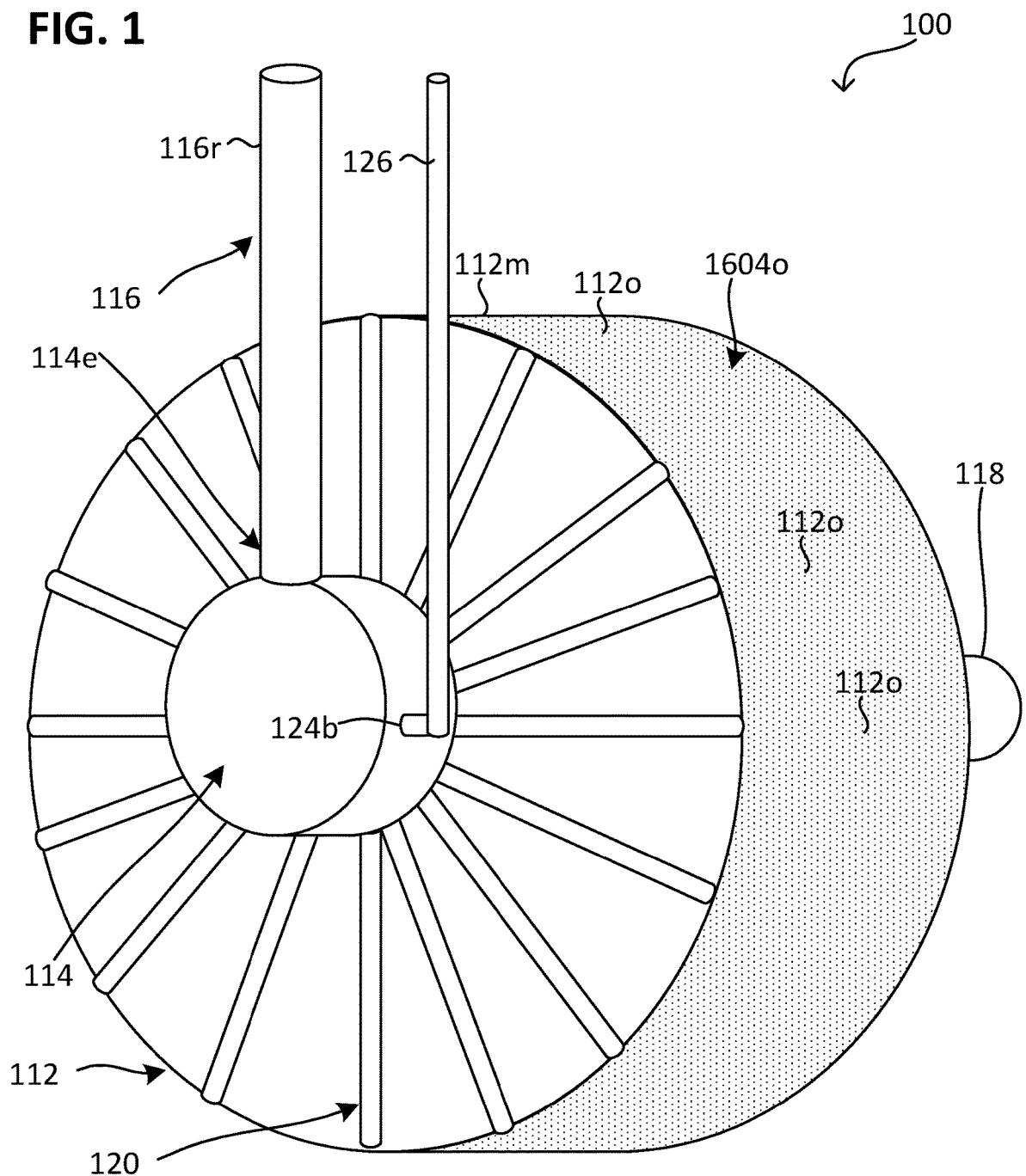

In the following detailed description, reference is made to the accompanying drawings, which form part of this description and in which specific embodiments in which the disclosure may be carried out are shown for purposes of illustration. In this respect, directional terminology such as for instance "at the top", "at the bottom", "at the front", "at the rear", "front", "rear", etc. is used with reference to the orientation of the figure(s) described. Since components of embodiments may be positioned in a number of different orientations, the directional terminology serves for purposes of illustration and is in no way restrictive. It goes without saying that other embodiments may be used and structural or logical changes may be made without departing from the scope of protection of the present disclosure. It goes without saying that the features of the various embodiments described herein by way of example may be combined with one another, unless otherwise specifically stated. The following detailed description is therefore not to be interpreted in a restrictive sense, and the scope of protection of the present disclosure is defined by the appended claims.

In the course of this description, the terms "connected" and "coupled" are used for describing both a direct connection and an indirect connection (for example ohmic and/or electrically conductive, for example an electrically conductive connection) and a direct coupling or indirect coupling. In the figures, identical or similar elements are provided with identical designations, wherever appropriate.

According to various embodiments, the term "coupled" or "coupling" may be understood in the sense of a (for example mechanical, hydrostatic, thermal and/or electrical), for example direct or indirect, connection and/or interaction. Multiple (that is, a number of) elements may for example be coupled to one another along a chain of interaction, along which the interaction (for example a signal) may be transmitted. For example, two elements coupled to one another may exchange an interaction with one another, for example a mechanical, hydrostatic, thermal and/or electrical interaction. According to various embodiments, "coupled" may be understood in the sense of a mechanical (for example physical) coupling, for example by means of a direct physical contact. A coupling may be configured to transmit a mechanical interaction (for example force, torque, etc.).

Open-loop control may be understood as meaning intentionally influencing a system. In this case, the state of the system may be changed in accordance with a predefinition. Closed-loop control may be understood as meaning open-loop control with a state change of the system as a result of disturbances additionally being counteracted. By way of illustration, an open-loop control device may have a feedforward controlled system and thus, by way of illustration, implement a sequence control that converts an input variable into an output variable. However, the controlled system may also be part of a closed-loop control circuit, such that a closed-loop control is implemented. In contrast to pure feedforward control, the closed-loop control exhibits a continuous influencing of the input variable by the output variable, which is brought about by the closed-loop control circuit (feedback). In other words, a closed-loop control may be used as an alternative or in addition to the open-loop control device, or closed-loop control may be carried out as an alternative or in addition to open-loop control. In the case of a closed-loop control, an actual value of the controlled variable (for example determined on the basis of a measurement value) is compared with a reference value (a setpoint value or a predefinition or a predefined value) and, accordingly, the controlled variable may be influenced by means of a manipulated variable (using an actuator) in such a way as to result as far as possible in a small deviation of the respective actual value of the controlled variable from the reference value.

A porous body or region may be understood as meaning that it includes a heterogeneous mixture of a solid material and a fluid (for example gaseous and/or liquid) material.

According to various embodiments, the term porous or porosity with respect to a material may be understood as meaning that the material forms a solid matrix (i.e. a solid body) in which a multiplicity of cavities are arranged. In other words, the material may be understood as the fraction of a porous body or porous region that is in a solid state of aggregation. According to various embodiments, porosity of the body or region may be understood as including a dimensionless measured variable that designates the ratio of cavity volume (volume of cavities or of the fluid material therein) to the overall volume (cavity volume plus the volume of the solid material) that spans the solid matrix.

According to various embodiments, the term porous or porosity with respect to a region or a body (for example the gas distributing structure or the roller shell) may be understood as meaning that the region or the body includes the solid matrix and also the cavities or the fluid material therein. In other words, porosity may be understood as including a dimensionless measured variable that designates the ratio of the volume of fluid material in the body or region to the overall volume of the region or of the body. A mass density of the region or of the body may decrease with increasing porosity, by way of illustration because the cavities are taken into account.

The porosity may then be defined as 1 minus the quotient of the apparent density (of the body) and the true density. The true density indicates the density of the solid material or of the solid matrix (i.e. exclusive of the cavities), while the apparent density represents (e.g., is based on) the volume of the body including the cavities or the fluid material therein.

The pore density indicates the ratio of the number of pores to the surface area (also referred to as pore area density) or of the number of pores to the length (also referred to as pore length density or pore linear density). The physical variable generalized for openings (for example channels, through-openings, pores or other cavities) is the structure density, for example the structure area density or structure linear density. By analogy with the intercept method, the structure linear density may for example indicate the number of boundaries between cavities along a transect. The physical variable that represents (e.g., is based on) those openings which also penetrate the solid body (for example a layer), i.e. which contribute to the gas conductivity (also referred to as permeability), may be referred to as the gas conducting structure density.

If, for example, the solid body is open-pored, its pore density may be equal to the gas conducting structure density. If the solid body is perforated or penetrated by gas channels, the density of the perforations or gas channels may be equal to the gas conducting structure density.

Depending on their size, the openings of the solid body may be referred to as pores, gas channels, perforations or gas lines. Perforation may be understood as including a technically generated and/or regularly arranged through-hole. The extent of the or each perforation (for example along the axis of rotation) may be greater than approximately 1 mm, for example than approximately 2 mm, for example than approximately 5 mm, for example than approximately 10 mm.

By way of illustration, the permeability is a measure for quantifying the permeability of a solid body to fluids (for example to a liquid or a gas). The permeability may for example be defined according to Darcy's law. A physical unit for the gas permeability through a solid body (also referred to as permeability) is for example the perm (in square meters). If there is no permeability, this is referred to as impermeability.

A flexible substrate may undergo temperature control during a coating process. For this purpose, a liquid-cooled roller (also referred to as transporting roller) may be used, over which the substrate is led. However, on account of the heat transfer between the substrate and the roller surface being poor, by way of illustration, the temperature control is not always sufficient. An improvement of the heat transfer may be achieved by introducing a gas between the substrate and the roller surface.

In other words, the substrate may have contact with the roller surface. Seen microscopically, the substrate surface in contact with the roller shell (also referred to as roller casing or outer casing) has a certain roughness, which respectively lies in a correspondingly punctiform manner on the roughness of the roller surface. The interspaces between the two surface roughnesses are filled with gas particles. These gas particles undertake part of the heat transport between the roller and the substrate. The number of gas particles is determined by way of the gas pressure.

The roller surface (also referred to as temperature control surface) of the temperature control roller may consist of an electrically nonconductive material (for example a ceramic). In order to be able to increase the pressing pressure of the substrate on the temperature control roller in addition to the pressing pressure resulting from the strip tension, an electrical voltage may be applied to the temperature control roller. As a result of the electrically insulating roller surface, a potential difference may be provided between the temperature control roller and the substrate and may provide an increase in the pressing pressure on account of the electrostatic attraction brought about as a result. The gas pressure may consequently be correspondingly increased, without the substrate lifting off, which improves the heat transfer.

The temperature control roller may have a double-walled temperature control roller body (also referred to as roller housing or simply as housing), for example a cooling roller body. An additional thin outer casing of microperforated sheet-metal shell (for example high-grade steel sheet) may be shrunk-on over the outer casing of the correspondingly machined housing. A system of layers including differently porous materials may be arranged on the metal sheet. A very fine-pored electrically nonconductive top layer may form the exposed termination of the temperature control roller.

If a gas is let in between the roller housing and the perforated metal sheet, it may distribute itself under the metal sheet as a result of the special machining of the roller housing and flow out of the perforation slits (also referred to as slits) into the porous system of layers. As a result of the porous system of layers, the gas is distributed very homogeneously over the entire temperature control surface and finally flows out of the temperature control surface almost over the full surface area.

The outer casing of the (for example double-walled) housing may be provided with a thread-like fluted structure, which in turn is interrupted by grooves running along the roller axis. The number and depth of the flutes and grooves may be dimensioned in such a way that a certain gas volume may be received. The grooves may be connected to a gas supply through corresponding bores from the end face of the outer casing. The shrunk-on metal sheet (for example high-grade steel sheet) may be provided with slits (for example 0.3 mm wide and 7 mm long) in a region from which gas is finally intended to flow out.

Since the metal sheet covers the flutes and grooves of the housing, the gas may only flow through the correspondingly overlapping slits. The metal sheet may be coated with the system of layers including differently porous layers. As a result of the lower open-porous layer, a good transverse distribution of the gas within this layer may be achieved. The very low-porous (also referred to as fine-porous) layer of nonconductive material lying thereover may provide a pressure drop and/or also provide that the gas leaves the temperature control surface in a very small amount from the many small pores very uniformly and over the full surface area.

Optionally, this outermost, exposed layer (also referred to as the terminating layer) of the temperature control roller may be produced from an electrically nonconductive material. By applying an electrical voltage to the electrically conductive layer lying under this terminating layer, if need be a potential difference with respect to the substrate may be provided, whereby an electrostatic attraction may be brought about between the temperature control roller and the substrate.

According to various embodiments, the provided temperature control roller may make it possible to improve the heat transfer between the temperature control roller and the substrate. In this way, significantly more favorable process conditions may be created.

According to various embodiments, the substrate (for example the strip substrate) may include or be formed by at least one of the following: a ceramic, a glass, a semiconductor (for example an amorphous, polycrystalline or monocrystalline semiconductor, for example silicon), a metal (for example aluminum, copper, iron, steel, platinum, gold, etc.), a polymer (for example plastic) and/or a mixture of various materials, such as for example a composite material (for example carbon-fiber reinforced carbon, or carbon-fiber reinforced plastic). For example, the substrate (for example the strip substrate) may include or be formed by a plastic film, a semiconductor film, a metal film and/or a glass film, and optionally be coated. As an alternative or in addition, the substrate may for example include fibers, for example glass fibers, carbon fibers, metal fibers and/or plastic fibers, for example in the form of a woven fabric, a gauze, a knitted or crocheted fabric or as a felt or nonwoven.

According to various embodiments, a substrate may be transported as a strip (also referred to as strip substrate) from roller to roller (i.e. be rewound between the circulatory winding rollers). The strip substrate may for example have a width (extent transversely to the transporting direction) in a range from approximately 1 cm (for example 30 cm) to approximately 500 cm or a width (also referred to as substrate width) of more than approximately 500 cm. Furthermore, the strip substrate may be flexible. By way of illustration, a strip substrate may be any desired substrate that may be wound up onto a roller and/or for example may be processed from roller to roller. Depending on the elasticity of the material used, the strip substrate may have a material thickness (also referred to as substrate thickness) in a range from approximately several micrometers (for example of approximately 1 µm) to approximately several millimeters (for example up to approximately 10 mm), for example in a range from approximately 0.01 mm to approximately 3 mm. The transporting rollers of the transporting arrangement may be axially longer than the strip substrate is wide.

In the course of this description, the term "metallic" may be understood as including or formed by a metal. In the course of this description, a metal (also referred to as metallic material) may include (or be formed by) at least one metallic element (i.e. one or more metallic elements), for example at least one element from the following group of elements: copper (Cu), iron (Fe), titanium (Ti), nickel (Ni), silver (Ag), chromium (Cr), platinum (Pt), gold (Au), magnesium (Mg), aluminum (Al), zirconium (Zr), tantalum (Ta), molybdenum (Mo), tungsten (W), vanadium (V), barium (Ba), indium (In), calcium (Ca), hafnium (Hf), samarium (Sm), silver (Ag), and/or lithium (Li). Furthermore, a metal may include or be formed by a metallic compound (for example an intermetallic compound or an alloy), for example a compound of at least two metallic elements (for example from the group of elements), such as for example bronze or brass, or for example a compound of at least one metallic element (for example from the group of elements) and at least one nonmetallic element (for example carbon), such as for example steel.

Depending on the intended application and the configuration, a transporting roller may be variously designed. For example, a transporting roller may be configured as a (for example active or passive) guide and/or deflection of the transporting path, for controlling the temperature (for example cooling) or driving the substrate transport. Such a transporting roller for controlling the temperature (also referred to as temperature control roller), for example a cooling roller, may for example be driven and its rotation may bring about the driving of the substrate transport. The temperature control roller may for example have a ceramic surface (for example a steel roller), which may for example be sprayed on.

According to various embodiments, a controlled gas supply to a temperature control roller (in that case also referred to as gas temperature control roller), for example cooling roller (in that case also referred to as gas cooling roller) is provided by means of gas exchange openings in the temperature control roller. Such a temperature control roller may for example be used in a vacuum installation for metal strip coating and/or film strip coating. With the (for example controlled) gas supply of a temperature control roller, lifting off of the substrate from the temperature control roller is prevented and sufficient gas for controlling the temperature of the substrate is fed.

According to various embodiments, a temperature control roller is provided (for example as a process roller for film coating installations), by means of which a gas (for example argon, nitrogen or some other inert gas) may be introduced between the temperature control surface (also referred to as the shell surface, casing surface or circumferential surface of the temperature control roller 112) of the temperature control roller (for example process roller) and the substrate. For this purpose, the temperature control surface of the temperature control roller has radial gas exchange openings. The gas exchange openings may be jointly connected to one another and/or supplied with gas by means of a network of interconnected pores, for example by means of multiple gas lines. A connection piece that is screwed in the housing of the temperature control roller may optionally be arranged on the end face of the process roller for each gas line. Each connection piece may for example be connected by means of a line structure.

The casing surface (also shell surface) of a body may be understood as including the (for example peripheral) surface, which is produced by rotation of a line about an axis of rotation. The outermost casing surface of the temperature control roller, which is exposed and is intended to lie against the substrate, may also be referred to as the temperature control surface. By means of the temperature control surface, thermal energy may be fed to and/or extracted from the substrate.

For easier understanding, hereafter reference is made to the process of cooling, i.e. to the extraction of thermal energy (also referred to as remove thermal energy, that is transferring the thermal energy out of something). What is described may however also apply analogously to the process of heating, i.e. to the supply of thermal energy (also referred to as feed thermal energy, that is transferring the thermal energy into something). The cooling and/or heating (e.g., beyond the thermal equilibrium) may also be referred to more generally as temperature control.

FIG. 1 illustrates a transporting arrangement 100 according to various embodiments in a schematic perspective view.

The transporting arrangement 100 may have: a temperature control roller 112 (for example a gas cooling roller 112), which has a (for example cylindrical) roller shell 112m and a supply device 114. The supply device 114 and the temperature control roller 112 may be provided jointly, for example mounted on one another, or else individually, for example separately from one another.

The roller shell 112m may provide the substrate bearing surface 1604o (also referred to as temperature control surface 1604o of the temperature control roller 112), on which the substrate is intended to lie.

The roller shell 112m (also referred to as roller casing or outer casing) may have a multiplicity of gas outlet openings 112o (also referred to as openings 112o). The gas outlet openings 112o may for example be arranged randomly and/or irregularly on the outer, exposed substrate bearing surface 1604o of the roller shell 112m and/or be spatially distributed. The gas outlet openings 112o may be formed in the substrate bearing surface and/or extend into the roller shell 112m.

The roller shell 112m may for example include or be formed by a dielectric (for example an oxide). As an alternative or in addition, the roller shell 112m may include or be formed by aluminum and/or zirconium (Zr), for example an oxide thereof. The oxide of the roller shell 112m may also include or be formed by an oxide of another metal, for example of chromium (chromium oxide), of titanium (titanium oxide) and/or of yttrium (yttrium oxide). For example, the roller shell 112m may include or be formed by a proportion by mass of approximately 15% (or less) of zirconium oxide ($ZrO_2$) and for example the remainder aluminum oxide ($Al_2O_3$).

The supply device 114 may have a connection 114e (for example a temperature-control liquid connection, for example cooling liquid connection) and a second connection 124b (for example a temperature-control gas connection, for example cooling gas connection).

In a mounted state and/or during operation, the first connection 114e may be connected in a fluid-conducting (for example liquid-conducting) manner to a cooling liquid supply 116. The cooling liquid supply 116 may for example have a pump and/or a heat exchanger. As an alternative or in addition, the cooling liquid supply 116 may have a pipeline 116r, which for example connects the pump to the first connection 114e in a fluid-conducting manner.

In a mounted state and/or during operation, the second connection 124b may be connected in a fluid-conducting (for example gas-conducting) manner to a cooling gas supply. The cooling gas supply may for example have a gas source, such as for example a gas tank, a gas cylinder or the like. Optionally, the cooling gas supply may have a pipeline 126, which connects the gas source to the second connection 124b in a fluid-conducting manner and/or is configured for controlling a gas flow in it in an open-loop (and/or closed-loop) manner (for example by means of a valve), for example on the basis of a gas pressure in the vacuum chamber and/or a temperature of the substrate.

The transporting arrangement 100 may also have a shaft 118, by means of which the temperature control roller 112 is mounted (for example rotatably). The shaft 118 may extend into the supply device 114 and/or be rotatably supported in it.

In a mounted state and/or during operation, the transporting arrangement 100 may optionally have a drive (not represented), which is coupled to the shaft 118, for example on the side of the shaft 118 that is opposite from the supply device 114.

The transporting arrangement 100 may also have a line structure 120, which connects the first connection 114e to a cooling device (not represented) and/or the second connection 124b to the gas outlet openings 112o in a fluid-conducting manner.

Optionally, the temperature control surface of the roller shell 112m may be configured in an electrically insulating (for example dielectric) manner or at least include or be formed by an electrically insulating material (for example a dielectric). For example, the roller shell 112m may include or be formed by a ceramic, for example an oxidic ceramic or a carbidic ceramic. In this way it may be prevented that an electrical voltage applied to the gas distributing structure 402 short-circuits with the substrate. For example, a breakdown voltage of the roller shell 112m may be more than 1000 volts (V), for example more than approximately 2000 volts (V), or more than 3000 volts (V).

Figure 2:
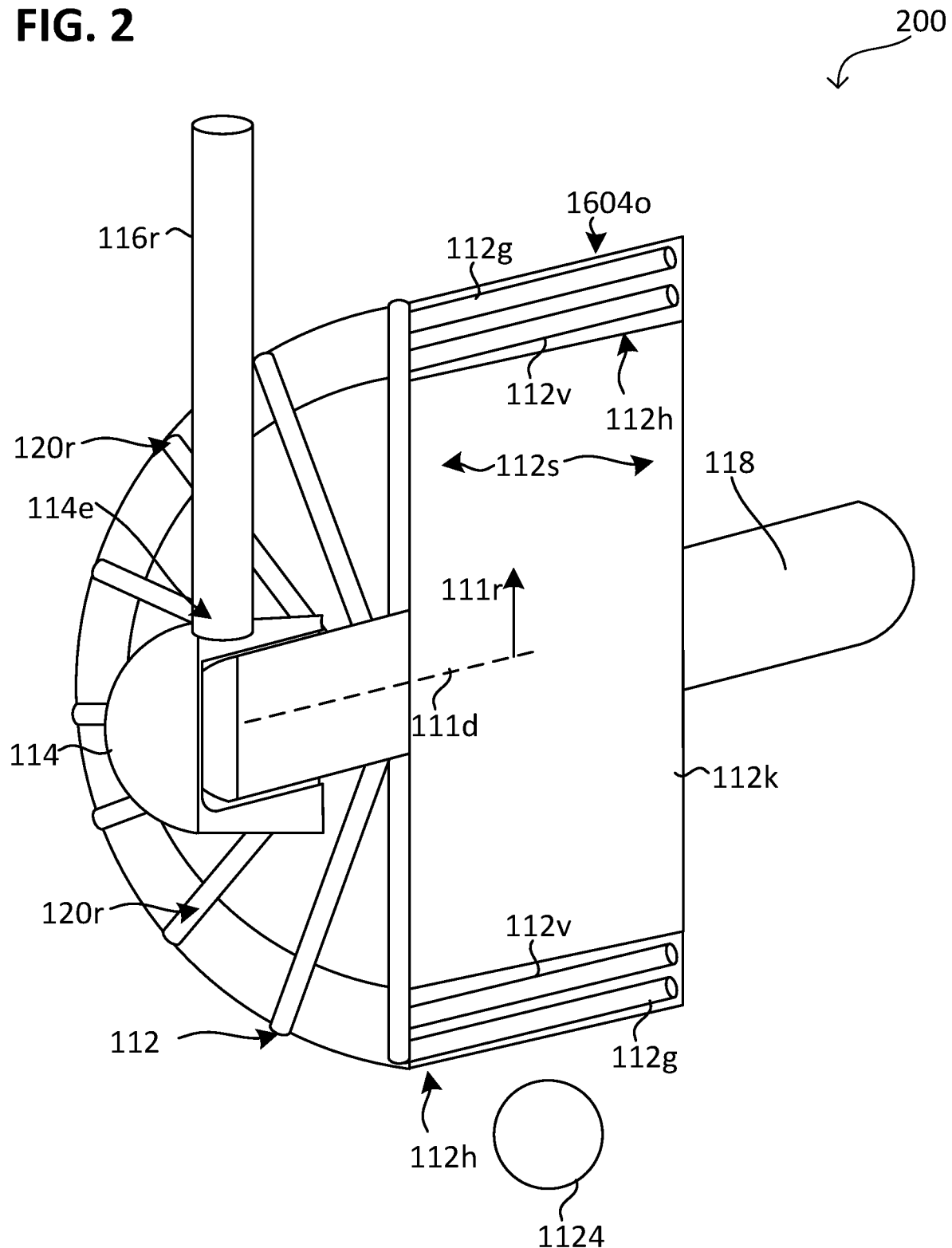
Figure 3:
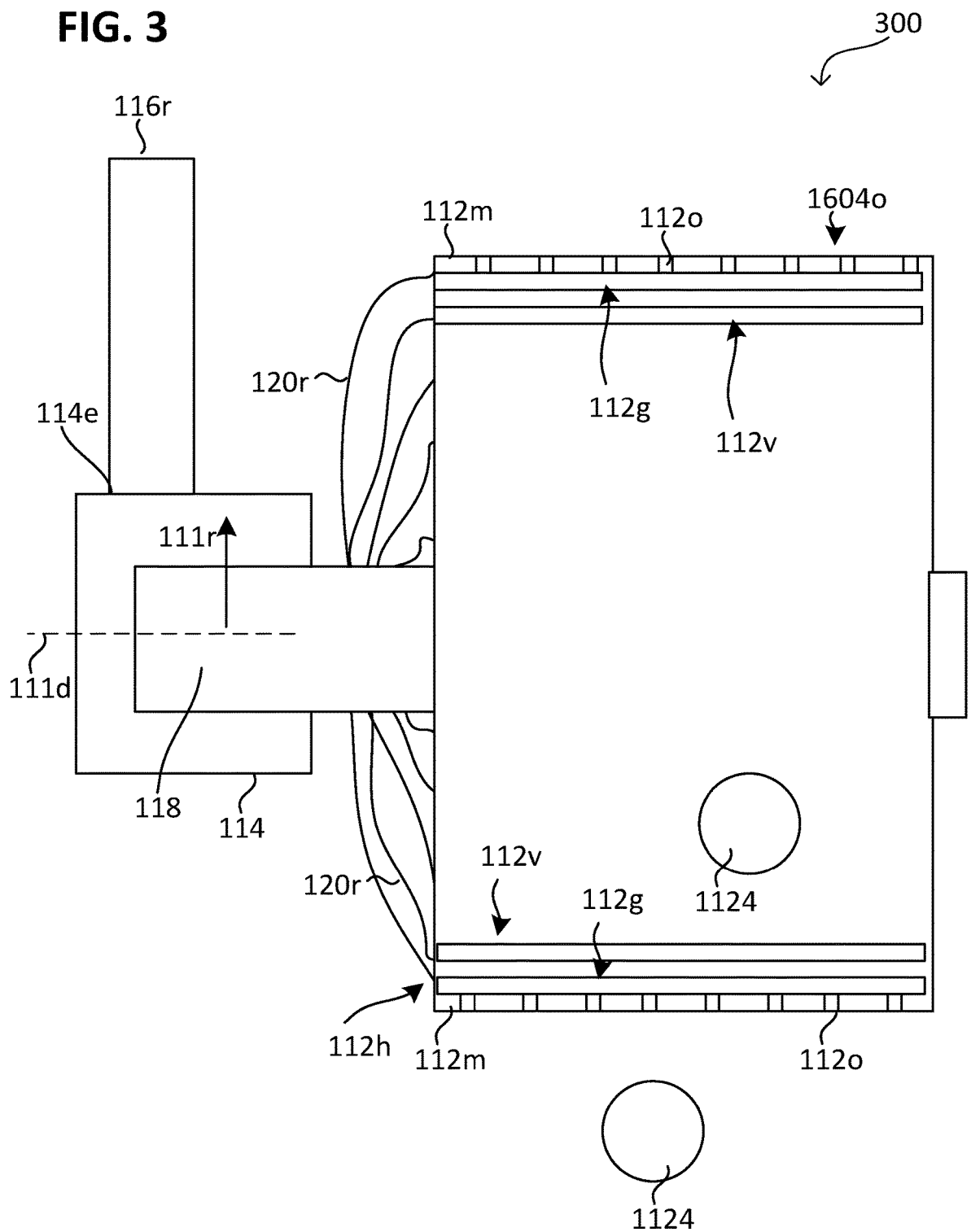

FIG. 2 illustrates a transporting arrangement 200, for example transporting arrangement 100, according to various embodiments in a schematic perspective cross-sectional view and FIG. 3 illustrates it in a schematic lateral cross-sectional view 300 (both in section along the axis of rotation 111d of the transporting arrangement 200).

The transporting arrangement 200 may have at least one cooling device 1124, which may for example provide a (for example electrical) heatsink, for example by means of a heat exchanger. The cooling device 1124 and/or at least one of its component parts may for example be arranged inside the temperature control roller 112. As an alternative or in addition, the or an additional cooling device 1124 (and/or another of its component parts) may be arranged outside the temperature control roller 112.

The (for example rotationally symmetrical) roller shell 112m or its temperature control surface 1604o may, by way of illustration, provide the outer, exposed surface of the temperature control roller 112.

The roller housing 112h (for example provided in the form of a hollow cylinder) may have a chamber (for example in the form of a cylinder casing), for example a double hollow cylinder, which is closed off and/or sealed (at the end faces and/or in a vacuum-tight manner) by means of end walls 112s.

The cooling device 1124 may have one or more cavities 112v (also referred to as cooling lines 112v) in the roller housing 112h (also referred to as roller main body 112h or roller outer tube 112h).

The temperature control roller 112 may have one or more than one additional axially extending cavity 112g (also referred to as gas line 112g), each gas line 112g of which is connected in a fluid-conducting (gas-conducting) manner to the multiplicity of gas outlet openings 112o, for example by means of the gas distributing structure, as described still more specifically later. The multiple gas lines 112g may for example be made to extend parallel to one another and/or be arranged next to one another, for example surrounding the axis of rotation 111d.

The line structure 120 may be connected in a fluid-conducting (gas-conducting) manner with the one or more than one gas line 112g, for example on the end face of the temperature control roller 112.

Optionally, the line structure 120 may have multiple pipelines 120r (for example hoses) that are made to extend away from the axis of rotation 111d and/or radially and at least in certain portions run outside the temperature control roller 112.

Figure 4:
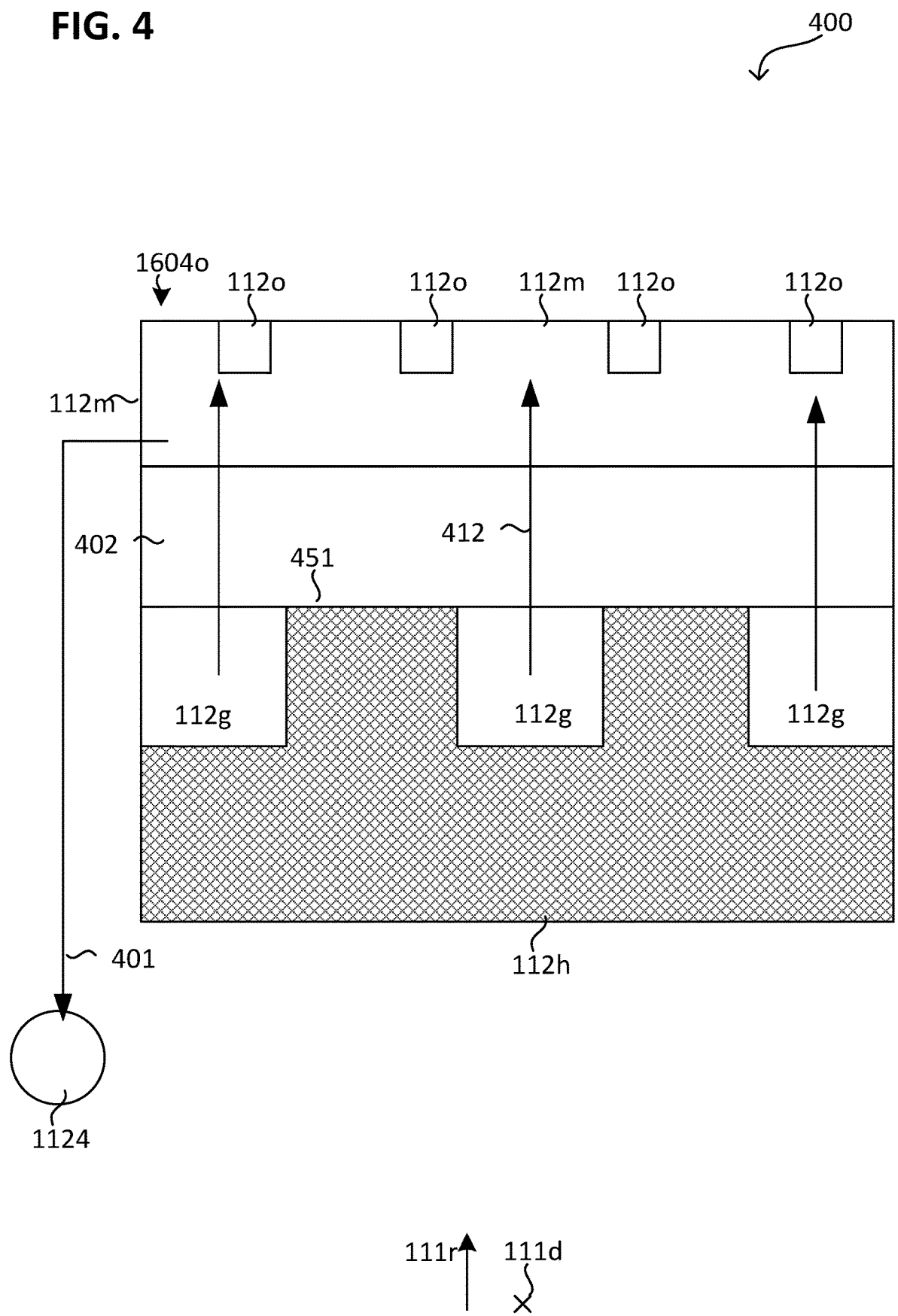

FIG. 4 illustrates the temperature control roller 112 according to various embodiments in a schematic cross-sectional view 400 (for example when viewed along the axis of rotation 111d).

The temperature control roller 112 may have the cylindrical (for example hollow-cylindrical) roller shell 112m, which has a multiplicity of gas outlet openings 112o. The cooling device 1124 may be configured to supply and/or extract thermal energy (also referred to as heat) to or from the roller shell 112m. For example, the cooling device 1124 may be configured to transport heat away from the roller shell 112m to outside the temperature control roller 112 or vice versa (as indicated, for example, by line 401).

The temperature control roller 112 may also have multiple gas lines 112g, which are made to extend along the axis of rotation 111d and are for example formed in the roller housing 112h and/or extend into it.

The temperature control roller 112 may also have a gas distributing structure 402, which couples the multiple gas lines 112g and the multiplicity of gas outlet openings 112o to one another in a gas-conducting manner, so that gas 412 may flow out of the gas lines 112g through the gas distributing structure 402 to the multiplicity of gas outlet openings 112o, at which it may leave the temperature control roller 112.

Generally, the gas distributing structure 402 may have a lower structure density (for example structure area density) than the multiplicity of gas outlet openings 112o. In other words, the gas channels of the temperature control roller 112 may branch to an increasingly greater extent in a radial direction 111r.

The structure density may represent (e.g., be based on) gas-conducting cavities. For example, the gas distributing structure 402 may have a lower cavity area density than the roller shell 112m. For example, an area density of the gas outlet openings 112o may be greater than an area density of cavities of the gas distributing structure 402. As an alternative or in addition to the structure area density, for example the cavity area density, the same relationship may also apply to a structure linear density.

An area density, for example the structure area density (for example cavity area density), may for example represent (e.g., be based on) a surface area in the form of a cylinder casing of the axis of rotation 111d. The linear density, for example structure linear density, may represent (e.g., be based on) a circumferential (closed) path transverse to the axis of rotation 111d or a path parallel to the axis of rotation 111d.

For example, the gas distributing structure 402 may be penetrated by a multiplicity of extended (for example away from the axis of rotation 111d) gas channels (for example apertures or pores), which the structure area density represents, e.g., on which the structure area density is based.

According to various embodiments, the gas distributing structure 402 may have one or more than one gas distributing layer, as described more specifically below, for example one or more than one of the following gas distributing layers: a first gas distributing layer 602, a second gas distributing layer 702 and/or a third gas distributing layer 802.

Optionally, the roller shell 112m may be porous, as described more specifically below.

Optionally, a heat distributing layer 451 may be arranged between the gas distributing structure 402 and the roller housing 112h. The heat distributing layer 451 may for example include or be formed by copper. More generally speaking, the heat distributing layer 451 may have a greater thermal conductivity than the gas distributing structure 402 and/or the roller housing 112h. For example, the roller housing 112h may include or be formed by steel.

Optionally, the heat distributing layer 451 may be electrodeposited on the roller housing 112h.

When using the heat distributing layer 451 (for example of copper), the dissipation of the process heat may be improved.

For example, with a power density introduced to the temperature control roller 112 and/or the substrate transported over it of approximately 70 kW/m², a thermal conductivity of the roller housing 112h (for example a high-grade steel casing) that is too low may lead to a temperature gradient of approximately 50 K. When using the heat distributing layer 451 (for example of highly heat-conductive copper), with the same power density a gradient of only a few kelvins (K) is obtained.

According to various embodiments, a roller body 112h of high-grade steel or construction steel with a copper casing 451 may be provided. The copper casing 451 may for example be electrodeposited.

Figure 5A:
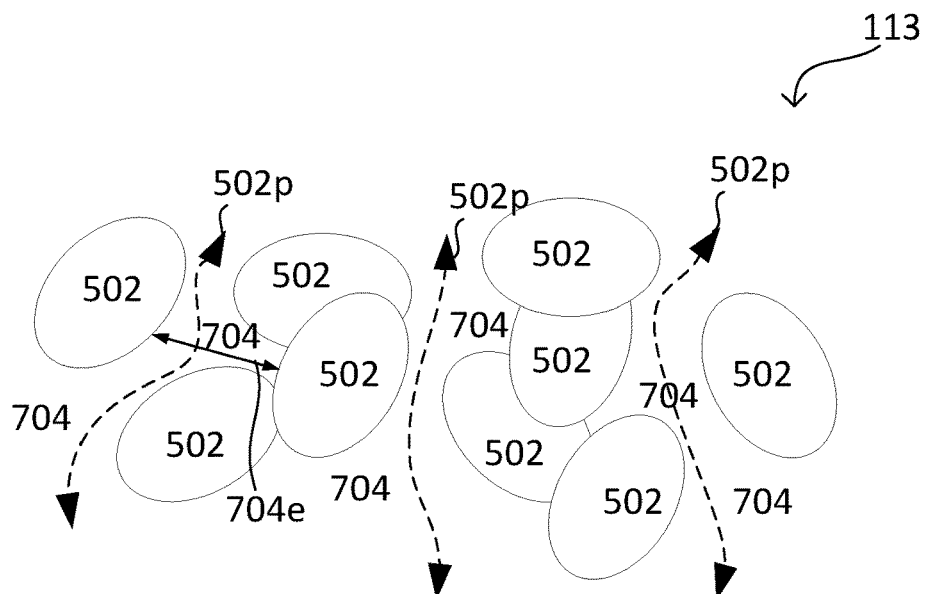
FIGS. 5A, 5B and 5C respectively show a porous solid body 113 according to various embodiments in a schematic cross-sectional view.
Figure 5B:
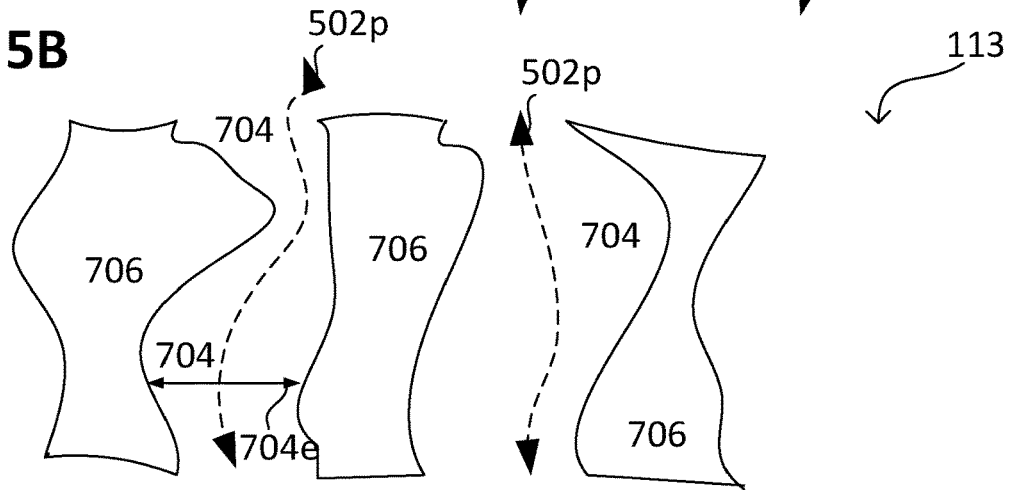
Figure 5C:
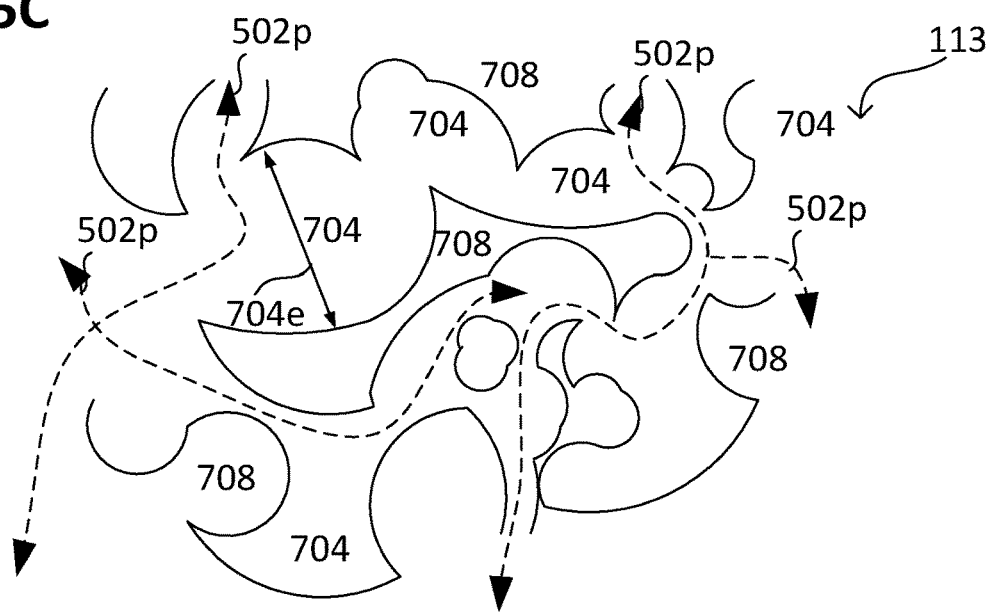

FIG. 5A to 5C illustrate a porous body 113 according to various embodiments in a schematic cross-sectional view (for example when viewed along the axis of rotation 111d), for example the roller shell 112m and/or the first gas distributing layer 602.

FIG. 5A shows a network of interconnected pores 704 (also referred to as pore network), the pore network being formed in an assembly (also referred to as structure or aggregate) of solid particles 502 (for example a loose fill and/or sintering of solid particles). The pores 704 of the pore network may be formed by the interspaces between the particles 502. The solid particles 502 of the assembly may be in physical contact with one another, for example at least in pairs. The solid particles 502 may be connected to one another, for example sintered together, adhesively bonded and/or fused. The pores 704 of the pore network may be connected to one another and therefore form a plurality of gas-conducting paths 502p (also referred to as gas channels), which extend through the body 113. In other words, the pores 704 of the pore network may be connected to one another along each path of the multiplicity of paths 502p (i.e., by way of illustration, form a pore network).

The pore network may consequently provide a multiplicity of gas channels, which form openings at the surface of the body 113 (for example the gas outlet openings 112o) and/or extend through the body 113.

FIG. 5B shows a pore network which may be formed in a partially eroded material 706 of the body 113. The partially eroded material 706 may have a plurality of pores 704, for example partially elongate pores, which are for example connected to one another.

FIG. 5C shows a pore network which may be formed in a solid foam 708 of the body 113. The solid foam 708 may enclose a multiplicity of pores 704.

According to various embodiments, the pore network may include at least one of the following pore types: micropores, i.e. pores 704 with an extent 704e (for example pore diameter) of less than approximately 2 nm; mesopores, i.e. pores 704 with an extent 704e in the range from approximately 2 nm to approximately 50 nm; and/or macropores, i.e. pores 704 with an extent 704e of greater than approximately 50 nm. The extent of a pore may be understood as meaning the diameter of a sphere that has the same volume as the pore.

Figure 6:
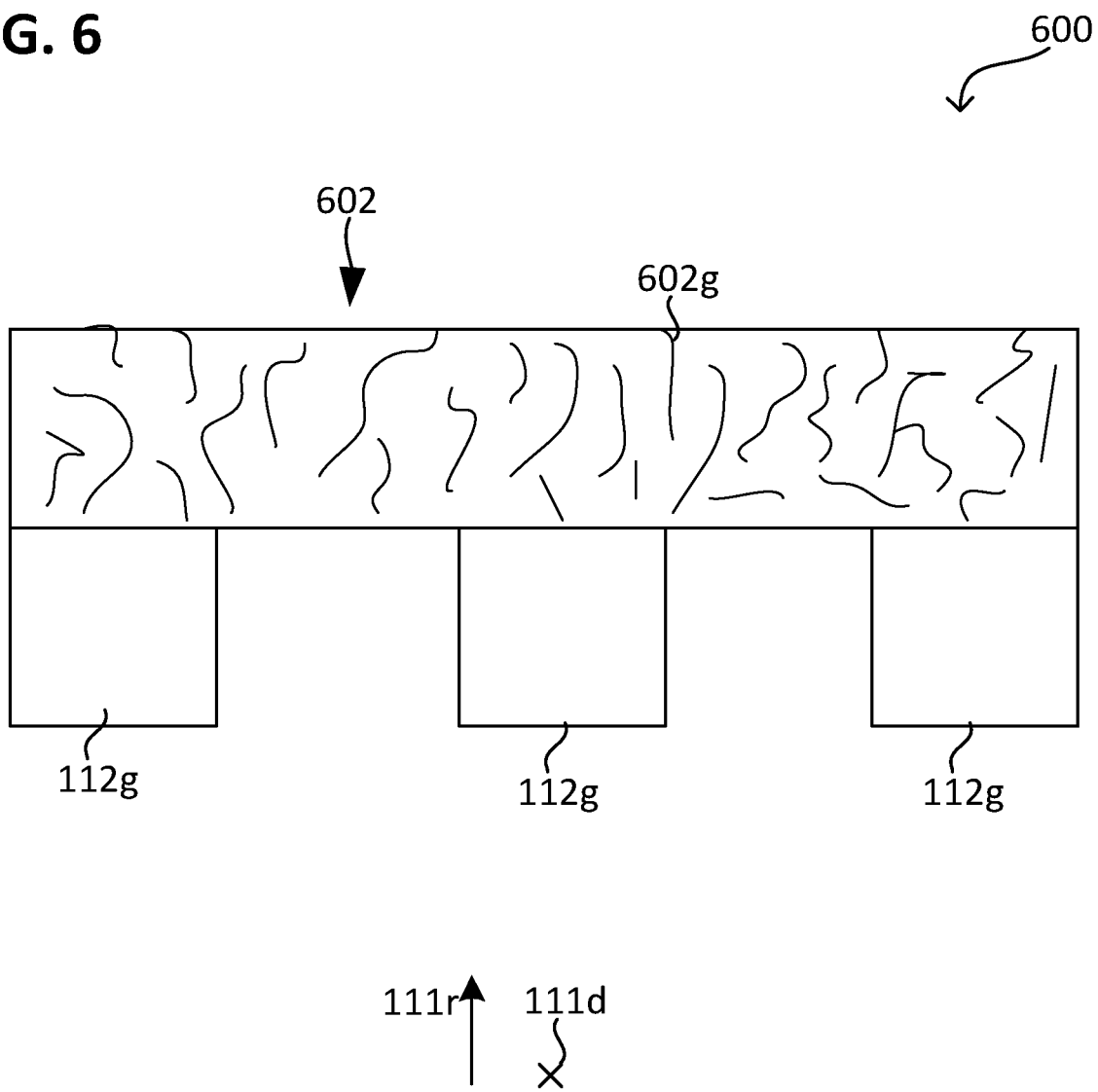

FIG. 6 illustrates the temperature control roller 112 according to various embodiments in a schematic perspective cross-sectional view 600 (for example when viewed along the axis of rotation 111d).

The gas distributing structure may have the first gas distributing layer 602, which is a porous layer. In other words, the gas distributing layer 602 may have a multiplicity of gas channels 602g or pores 602g connected to gas channels, which the structure density represents, e.g., on which the structure density is based.

The first gas distributing layer 602 may have a lower spatial pore density or pore area density than the roller shell 112m. Optionally, the first gas distributing layer 602 may have a greater spatial pore size than the roller shell 112m. Optionally, the first gas distributing layer 602 may have a greater porosity than the roller shell 112m.

Optionally, the first gas distributing layer 602 may be configured as electrically conductive, or at least include or be formed by an electrically conductive material. Electrically conductive may be understood herein as having an electrical conductivity of more than approximately 1 Siemens per meter (S/m), for example more than approximately $10^3$ S/m or approximately $10^3$ S/m. As an alternative or in addition, the first gas distributing layer 602 may include or be formed by a metal, for example aluminum.

As an alternative or in addition, the first gas distributing layer 602 may have an electrical conductivity that is more than a multiple of (for example more than 10 times, 100 times or 1000 times) that of the roller shell 112m.

Optionally, the roller shell 112m may have a gradient in the pore density, as described still more specifically later. Then, the first gas distributing layer 602 may optionally be omitted.

Figure 7:
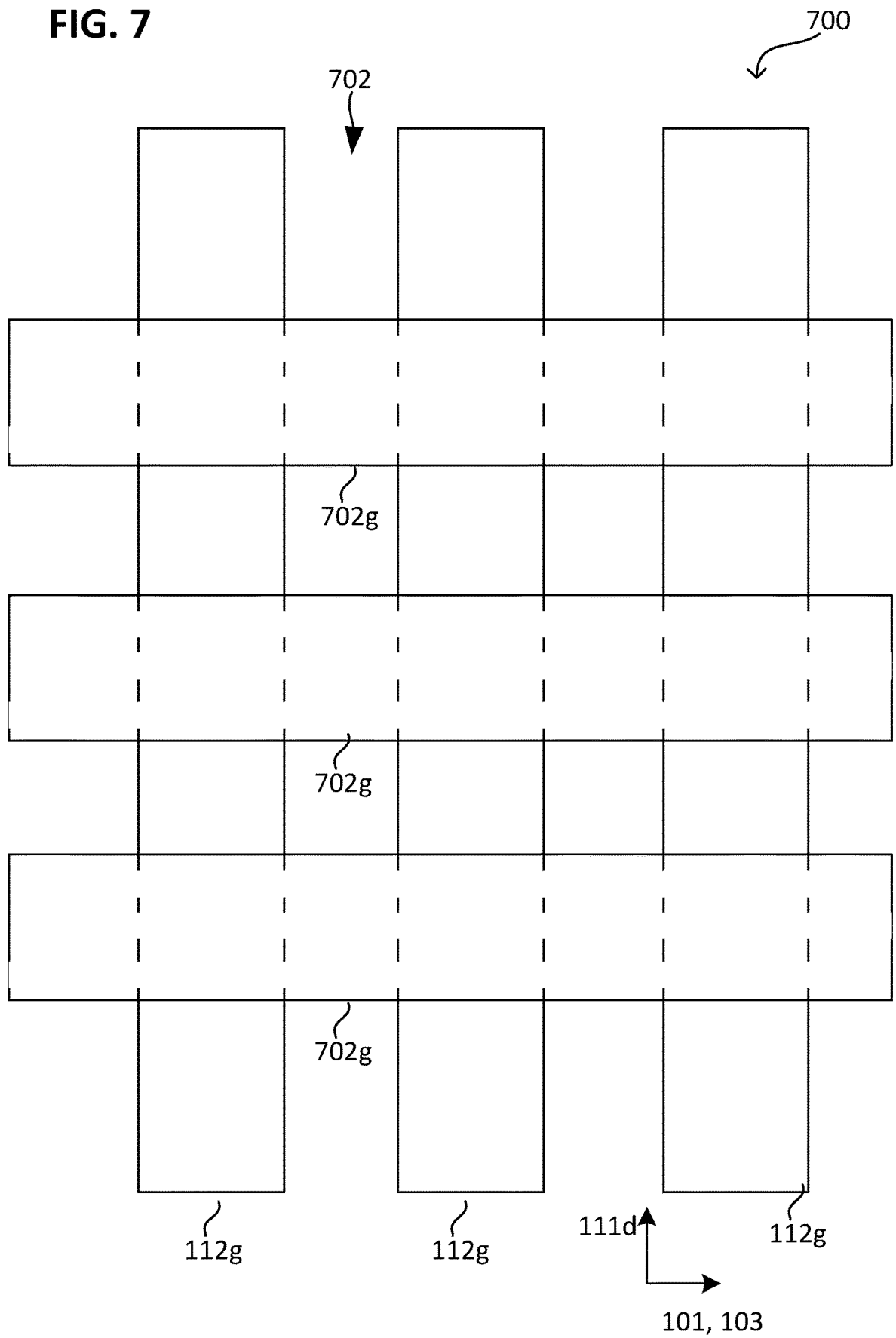

FIG. 7 illustrates the temperature control roller 112 according to various embodiments in a schematic perspective cross-sectional view 700 (for example in section along the cylindrical cross-sectional area 101, 103).

The cylindrical cross-sectional area 101, 103 may surround the axis of rotation 111d and be perpendicular to the radial direction 111r, which is transverse to the axis of rotation 111d.

The gas distributing structure may as an alternative or in addition to the first gas distributing layer 602 have the second gas distributing layer 702.

For example, the second gas distributing layer 702 may be arranged between the first gas distributing layer 602 and the gas lines 112g.

Optionally, the second gas distributing layer 702 may have a lower structure area density than the first gas distributing layer 602 and/or than the roller shell 112m. As an alternative or in addition, the second gas distributing layer 702 may have a greater structure area density than the multiplicity of gas lines 112g.

The second gas distributing layer 702 may have one or more than one gas channel (also referred to as circumferential channel 702g), which is for example made to extend transversely to the multiple gas lines 112g. As an alternative or in addition, the or each circumferential channel 702g may connect multiple or all of the gas lines 112g to one another in a gas-conducting manner.

The or each circumferential channel 702g may for example be formed in the roller housing and/or extend into it.

Optionally, the or each circumferential channel 702g may be made to extend longitudinally around the axis of rotation, for example along a helical line (more generally in the form of a spiral) or along a circular arc. Optionally, the or each spiral circumferential channel 702g may be made to extend longitudinally around the axis of rotation multiple times. As an alternative, the or each arcuate circumferential channel 702g may span approximately 360°, for example be made to extend along a closed path.

Optionally, two circumferential channels 702g that are directly adjacent to one another may be connected to one another, for example to form a common helical line.

Generally, the second gas distributing layer 702 or its circumferential channels 702g may in various embodiments also be omitted.

Figure 8:
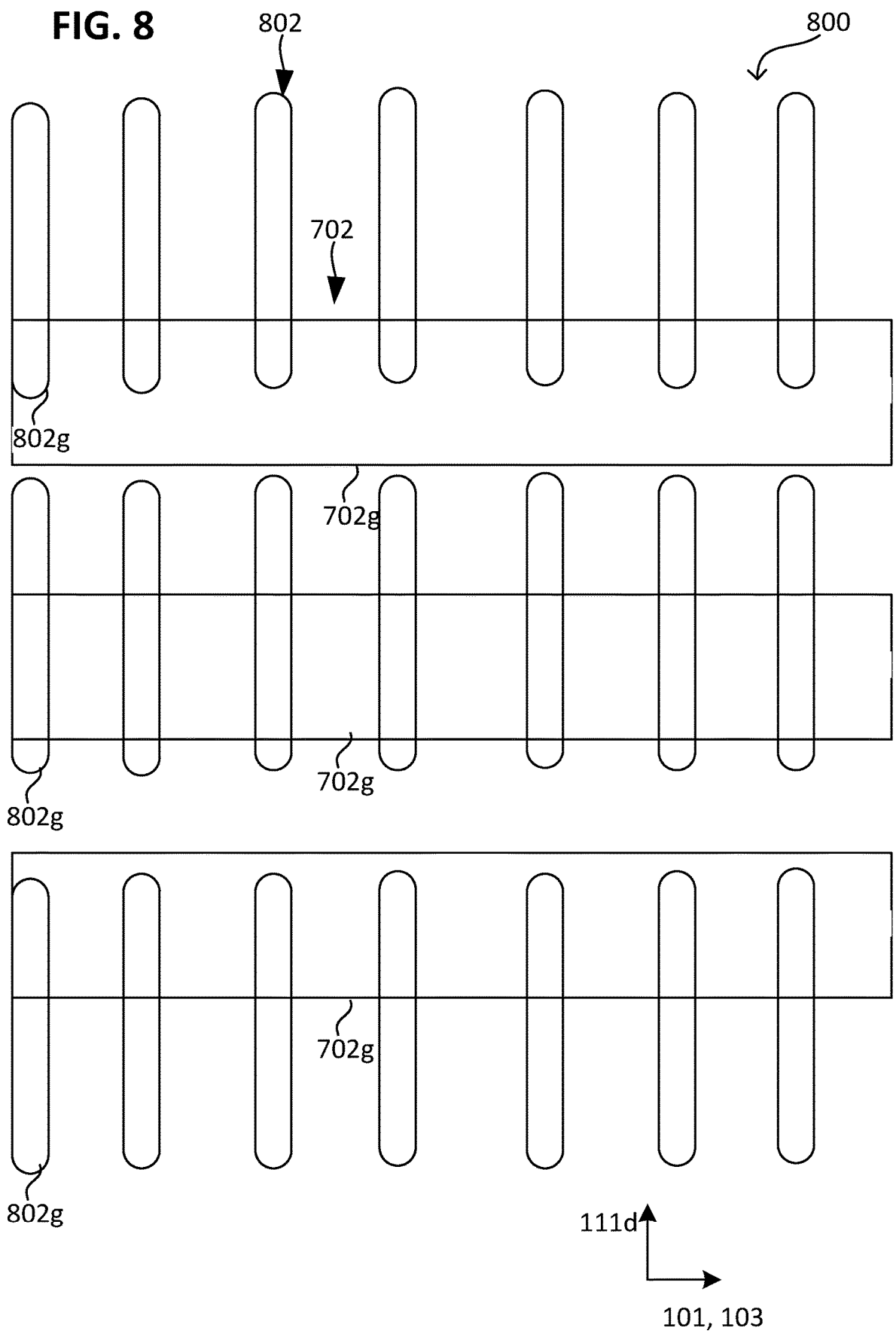

FIG. 8 illustrates the temperature control roller 112 according to various embodiments in a schematic perspective cross-sectional view 800 (for example in section along the cylindrical cross-sectional area 101, 103).

The gas distributing structure may as an alternative or in addition to the first gas distributing layer 602 or to the second gas distributing layer 702 have the third gas distributing layer 802.

For example, the third gas distributing layer 802 may be arranged between the roller shell 112m (for example the first gas distributing layer 602) and the gas lines 112g. For example, the third gas distributing layer 802 may be arranged between the roller shell 112m (for example the first gas distributing layer 602) and the second gas distributing layer 702.

Optionally, the third gas distributing layer 802 may have a lower structure area density than the first gas distributing layer 702 and/or than the roller shell 112m. As an alternative or in addition, the third gas distributing layer 802 may have a greater structure area density than the multiplicity of gas lines 112g or than the second gas distributing layer 702.

The third gas distributing layer 802 may have one or more than one perforation 802g (for example punch-out), which for example is made to extend longitudinally along the axis of rotation 111d. For example, the third gas distributing layer 802 may have multiple groups of perforations 802g, of which all of the perforations 802g of each group adjoin the same circumferential channel 702g.

The or each perforation 802g may extend along a linear path through the third gas distributing layer 802.

For example, the or each perforation 802g may have an extent along the axis of rotation 111d (longitudinal extent) that is greater than an extent parallel thereto of the or each circumferential channel 702g. As an alternative or in addition, a distance between directly adjacent perforations 802g along the axis of rotation 111d may be less than a distance parallel thereto between directly adjacent circumferential channels 702g.

For example, a distance between directly adjacent perforations 802g transversely to the axis of rotation 111d may be less than an extent parallel thereto of the gas lines 112g.

For example, the or each perforation 802g may be formed as an oblong hole.

Generally, the third gas distributing layer 802 may in various embodiments also be omitted.

If the third gas distributing layer 802 is present, it may for example be shrunk-on. In this case, the second gas distributing layer 702, lying thereunder, or the lowermost layer 1402, lying thereunder, may be turned smooth and/or polished, for example fine-finished.

If the third gas distributing layer 802 is omitted, as an alternative or in addition to this a porous (for example thermally sprayed-on) adhesion promoter layer 802 may optionally be used. The adhesion promoter layer 802 may for example include nickel (Ni), molybdenum (Mo), chromium (Cr), yttrium (Y) and/or aluminum (Al), for example an alloy thereof, for example an NiAl layer, an NiCr layer, an NiCrAlY layer, and/or an Mo layer. The adhesion promoter layer may also adhere well on the smooth underlying surface.

Figure 9:
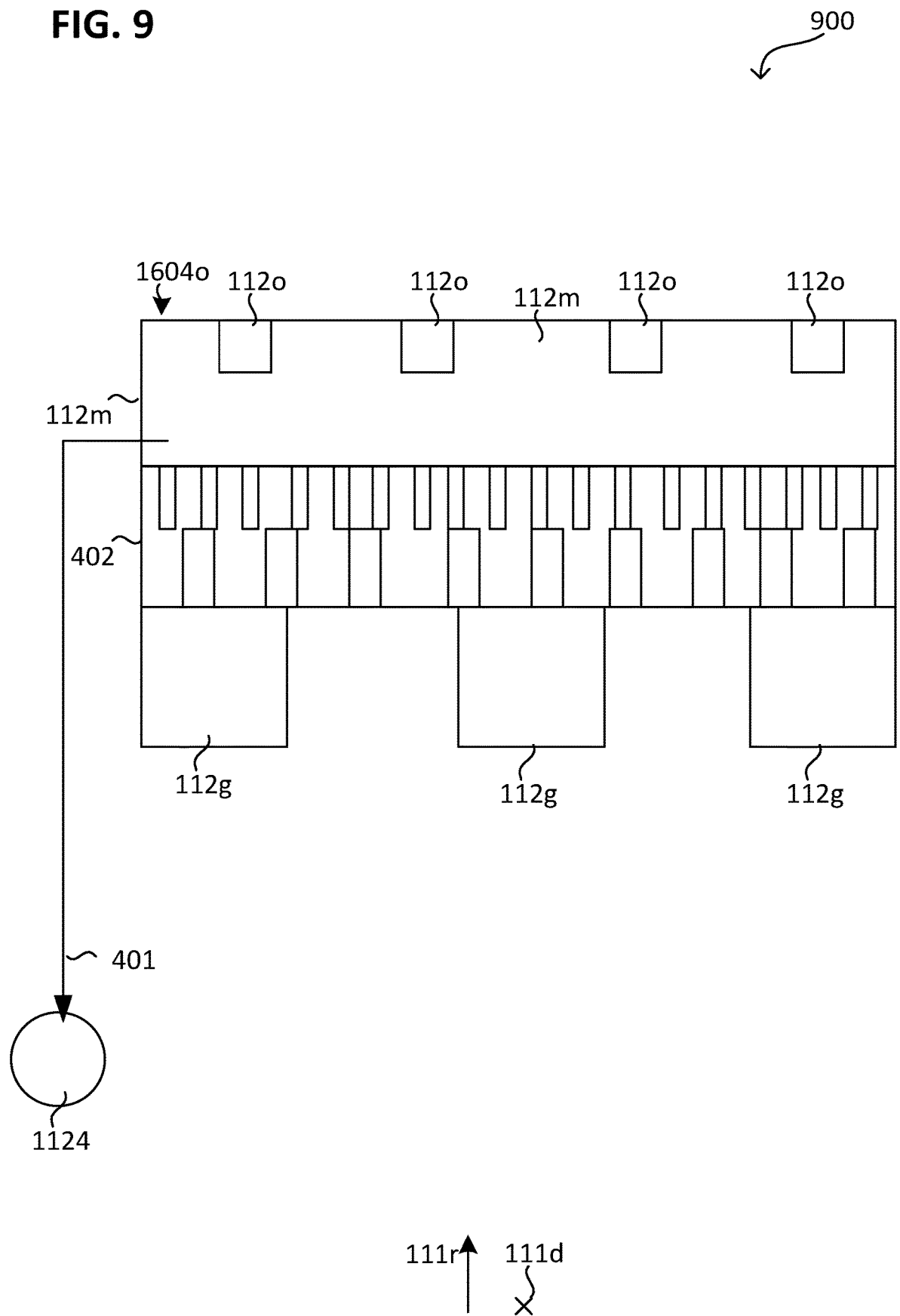

FIG. 9 illustrates the temperature control roller 112 according to various embodiments in a schematic perspective cross-sectional view 900 (for example when viewed along the axis of rotation 111d).

According to various embodiments, the structure density of the gas distributing structure 402 may increase in a direction 111r away from the axis of rotation 111d (for example in the radial direction 111r).

For example, the multiple gas distributing layers 602, 702, 802 of the gas distributing structure 402 may differ from one another in their structure density (for example in pairs). As an alternative or in addition, the gas distributing layer that is at a greater distance from the axis of rotation 111d than another gas distributing layer may have a greater structure density than the other gas distributing layer.

As an alternative or in addition, the roller shell 112m may have a gradient (for example along a direction away from the axis of rotation) in the structure density, for example a gradient in the pore density. The gradient may for example have a direction parallel to the radial direction 111r. For example, the pores at the temperature control surface 1604o of the roller shell 112m, which provide the multiplicity of gas outlet openings, may have the greatest pore area density of the temperature control roller 112. As an alternative or in addition, the pore area density of the roller shell 112m may decrease in a direction toward the axis of rotation 111d.

A gradient in a parameter may be understood herein as including that the parameter has a downward slope (or an upward slope). For example, the parameter may change continuously and/or steadily along a length, for example in that along the length it assumes each value between the values at the ends of the length just once. This should be distinguished from the case in which the parameter assumes a multiplicity of discrete values. The direction of the gradient in this case refers to the direction of the maximum slope.

Figure 10:
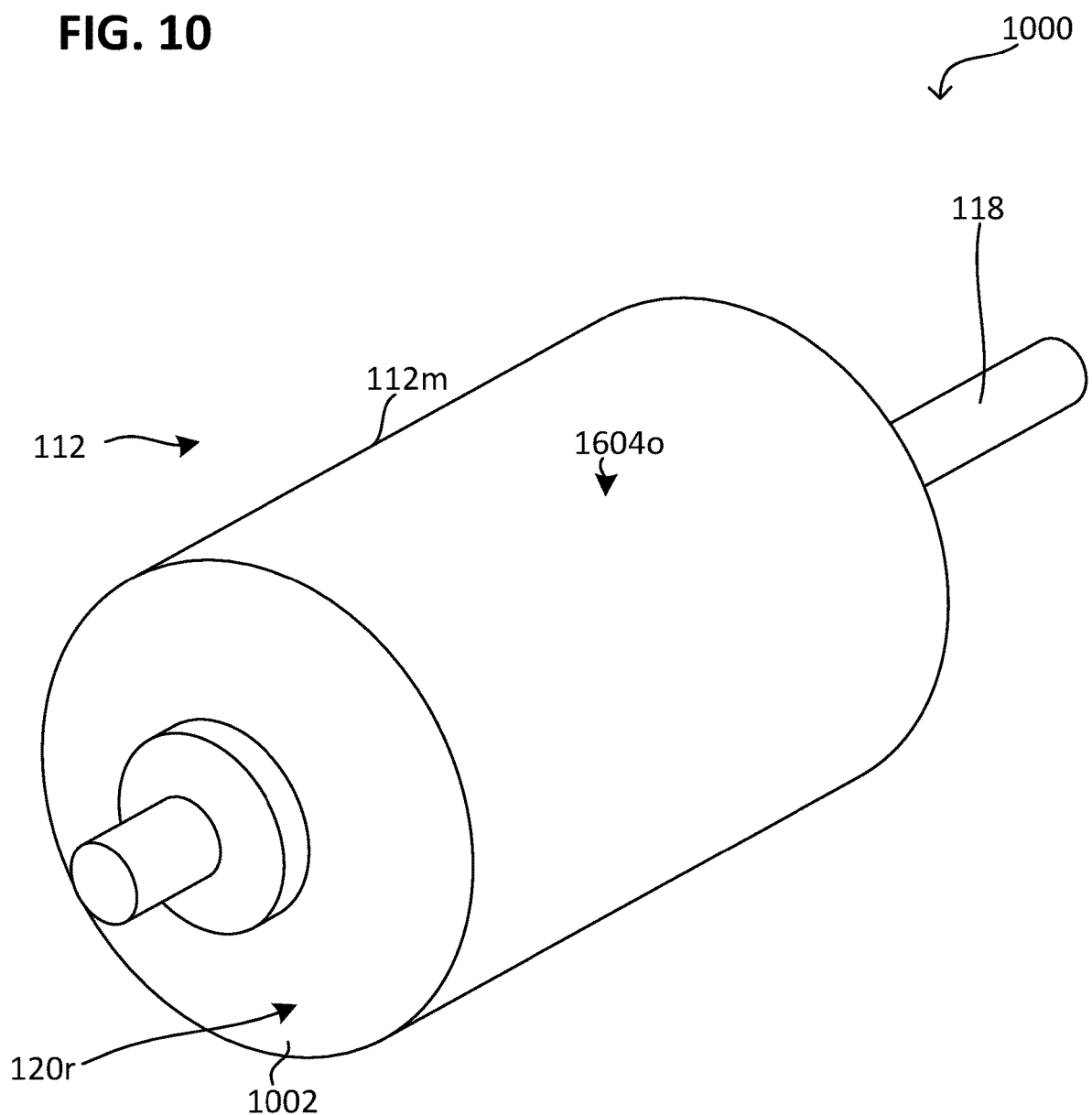
Figure 11:
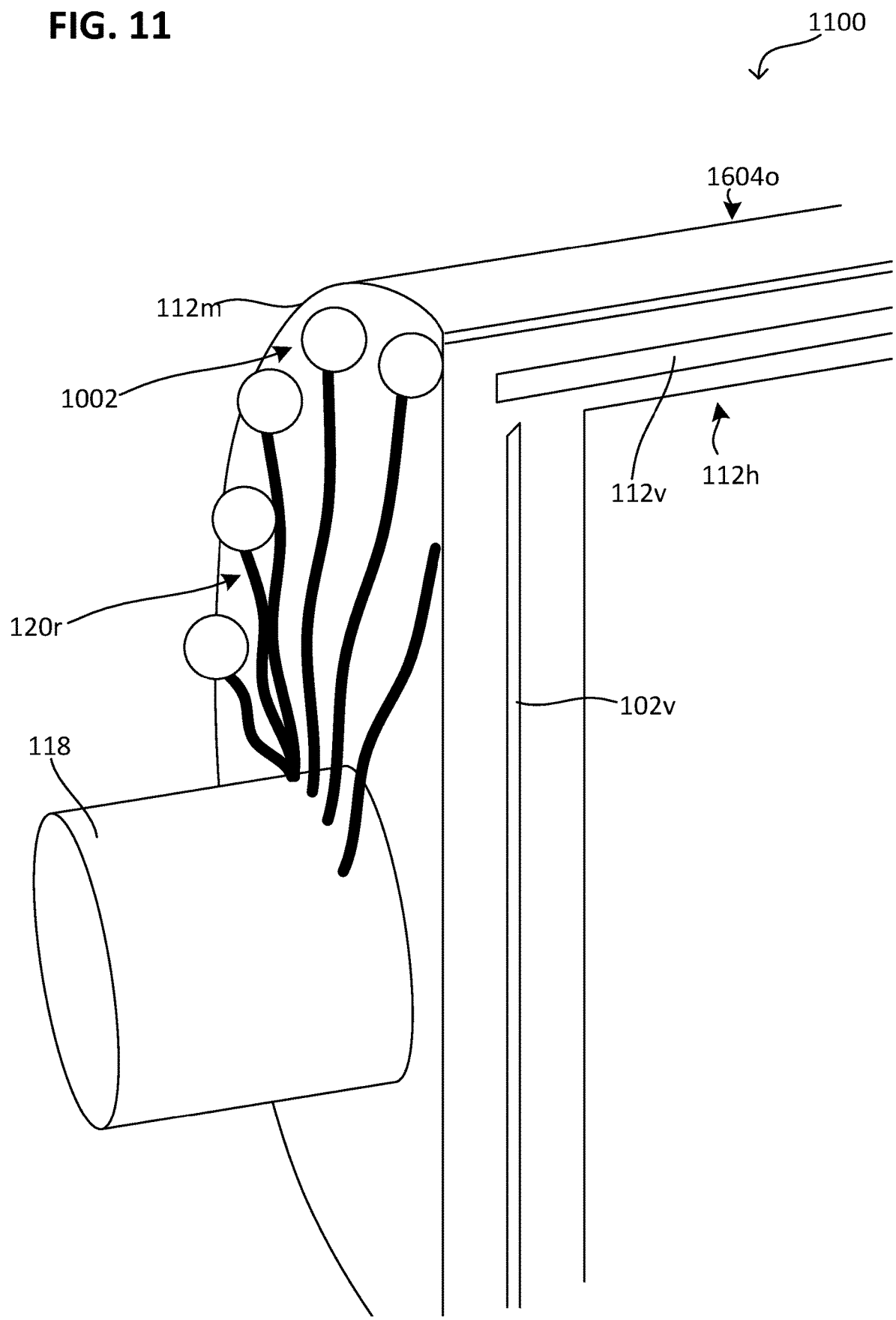

FIG. 10 illustrates a transporting arrangement 1000 according to various embodiments in a schematic perspective view, for example the transporting arrangement 100 or 200, and FIG. 11 shows this in a sectional perspective view 1100.

According to various embodiments, the temperature control roller 112 may have multiple gas connections 1002, each gas connection 1002 of which is coupled in a gas-conducting manner to precisely one gas line 112g of the multiple gas lines 112g. The multiple gas connections 1002 may for example be coupled in a gas-conducting manner to the pipelines 120r.

FIG. 12 illustrates a transporting arrangement 1200, for example the transporting arrangement 100, 200 or 1000, according to various embodiments in a schematic perspective view.

The perforations 802g may be provided, as described above, for example by means of apertures in a plate, for example in a metal sheet. As an alternative or in addition, the third gas distributing layer 802 may include a multiplicity of filaments, between which the perforations 802g are formed. The multiplicity of filaments may for example form meshes, which respectively surround a perforation 802g. The filaments may for example include or be formed by wire.

The multiple filaments may form a meshwork, for example in the form of a grid, a knitted, braided or woven fabric or a gauze. As an alternative or in addition, the multiple filaments may include or be formed by a metal, for example steel and/or copper. For example, the gas distributing layer 802 may include or be formed by a metal woven fabric, metal knitted fabric and/or metal braided fabric, for example a copper woven fabric.

For example, the meshwork (for example a grid) may be provided by means of a screen fabric. The meshwork (for example its filaments) may for example include or be formed by high-grade steel. For a copper surface (for example of the heat distributing layer 451), the meshwork may for example also be provided by means of a copper woven fabric. As an alternative or in addition, the meshwork (for example its filaments) may include or be formed by aluminum. This improves the thermal coupling.

The mesh width of the meshwork may for example be in a range from approximately 0.5 mm to approximately 1.5 mm, for example approximately 1.2 mm. As an alternative or in addition, a thickness of the filaments (for example a wire thickness) may be in a range from approximately 0.1 mm to approximately 0.5 mm, for example approximately 0.2 mm. The thickness of the filaments may be their extent transverse to their longitudinal extent.

The greater the mesh width, the better the gas conductivity may be, i.e. the reach-through and bond of the sprayed layer (more generally roller shell 112*m*) to the roller main body, and/or the poorer the groove bridging may be. The smaller the mesh width, the better the groove bridging may be and/or the poorer the bond of the sprayed layer to the roller main body 112*h* and/or the lowermost layer 1402 may be. A better bond between the roller main body 112*h* or the lowermost layer 1402 and the sprayed layer may provide a greater mechanical stability and the heat dissipation.

There may be a balance between the two states for example with mesh widths in a range from approximately 0.8 mm to approximately 1.2 mm. The wire thickness may for example be chosen to be as small as possible, in order to keep down the disturbance caused by the meshwork (for example screen fabric) in the layer structure and to make a good bond with the underlying surface possible.

The application of the meshwork (for example screen fabric) on the roller main body 112*h* and/or the lowermost layer 1402 may take place in various ways. For example, the meshwork may only be placed over the grooves 112*g*, 702*g*. As an alternative or in addition, the meshwork may be at least partially arranged in the grooves 112*g*, 702*g* (also referred to as an insert).

For example, the roller main body 112*h* or the lowermost layer 1402 may be covered radially over the full surface area by means of the meshwork (for example as a screen insert), since there the meshwork lies with better contact on the surface area and results in a homogeneous disturbance in the roller shell 112*m* (for example sprayed layer). With partial coverage (for example only over or in the grooves 112*g*, 702*g*), a greater inhomogeneity may result, since there is additionally also the transition between the meshwork and the free casing area.

Furthermore, the meshwork may then lie with less contact on the roller main body and, as a result, the risk of inadequate layer bonding to the main body 112*h* or the lowermost layer 1402 may increase.

The second gas distributing layer 702 or its circumferential channels 702*g* may for example also be omitted.

The fastening of the meshwork on a copper surface (for example the heat distributing layer 451) for example by means of a spot welding technology may be made more difficult. Therefore, in this case a different material bonding connection may be produced, for example by means of an adhesive, for example by means of a polymer adhesive, for example by means of an epoxy resin or a two-component adhesive.

More generally speaking, the gas distributing layer 802 may for example inhibit the first gas distributing layer 602 and/or the roller shell 112*m* from penetrating during application into the gas distributing layer 702 or its circumferential channels 702*g* or into the gas lines 112*g*. This risk with respect to penetration may for example be increased if the first gas distributing layer 602 and/or the roller shell 112*m* are applied by means of a spraying process.

In that case, the gas distributing layer 802 may also be provided differently, for example by means of inserting microslit and microbent sheet metal strips into the circumferential channels 702*g* and/or into the gas lines 112*g*, by means of an insert of fine spring strands and/or woven metal hoses into the circumferential channels 702*g* and/or into the gas lines 112*g*.

In other words, the gas distributing layer 802 may be at least partially arranged in the circumferential channels 702*g* and/or in the gas lines 112*g*.

If the gas distributing layer 802 includes the multiple filaments, for example the meshwork thereof, the surface lying thereunder (for example of the second gas distributing layer 702) may be gently rough-blasted, for example before the meshwork (for example the screen fabric) is placed on. As an alternative or in addition, tangential turned ruts may be formed by means of a turning process. More generally speaking, the surface lying thereunder may be roughed or smoothed.

If the gas distributing layer 802 is shrunk-on, it may be necessary that the layer lying thereunder is particularly smooth (for example fine-finished), since a high surface quality is beneficial to the result of the shrinking-on of the gas distributing layer 802 (for example a metal sheet). If the gas distributing layer 802 includes the multiple filaments, on the other hand, the surface may be rougher, for example roughed or smoothed.

A roughed surface may have a roughness in a range from approximately 3.2 µm (micrometers) to approximately 25 µm, for example scores that may be felt and are visible to the eye. A smoothed surface may have a roughness in a range from approximately 1.6 µm to approximately 3.2 µm, for example scores that are still visible to the eye and/or may not be felt. A finish-machined surface may have a roughness in a range from approximately 0.8 µm to approximately 1.6 µm, for example scores that are no longer visible to the eye.

Figure 13A:
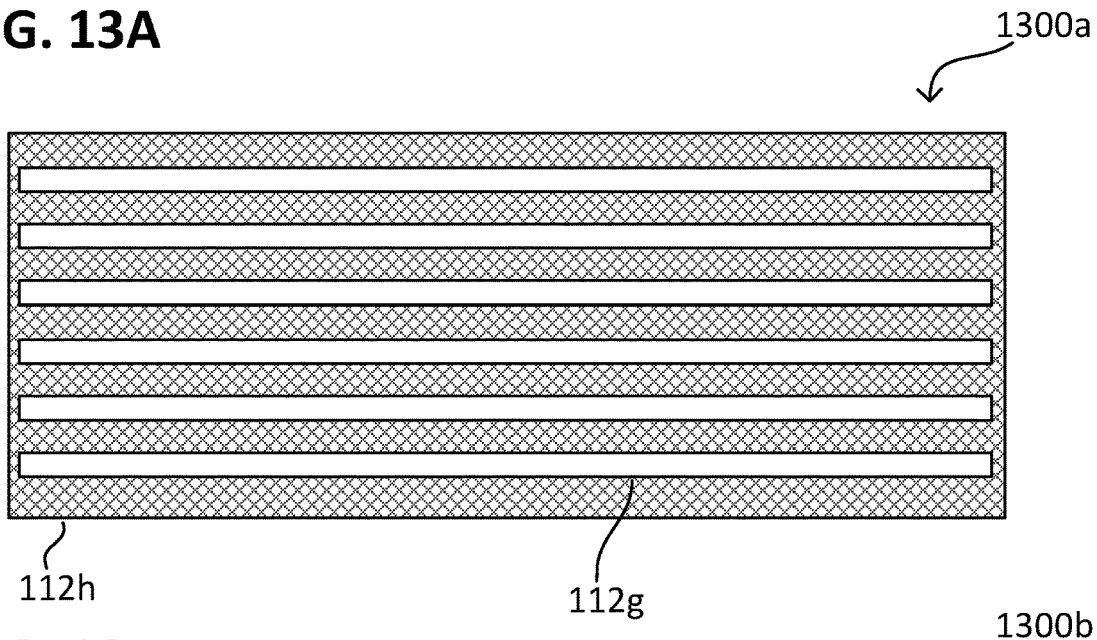
Figure 13B:
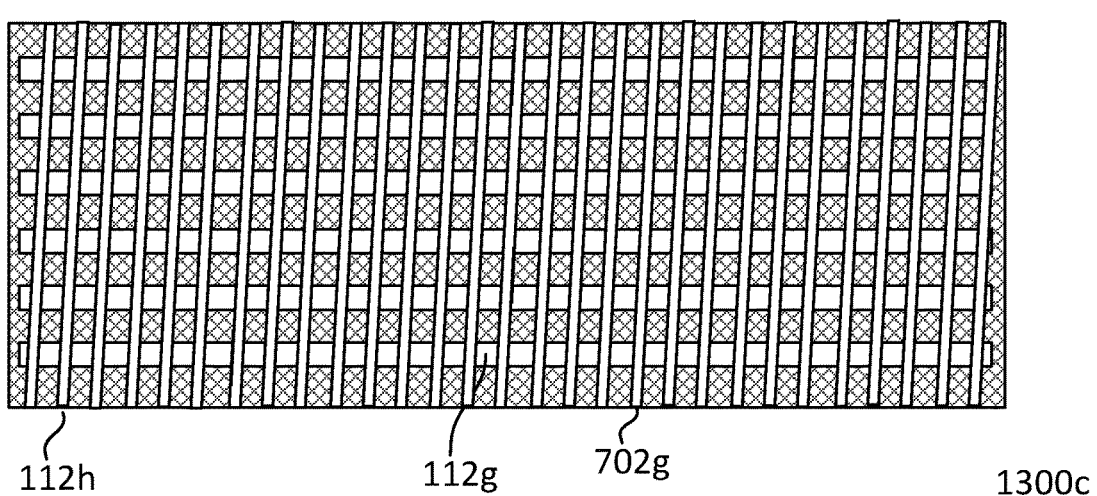
Figure 13C:
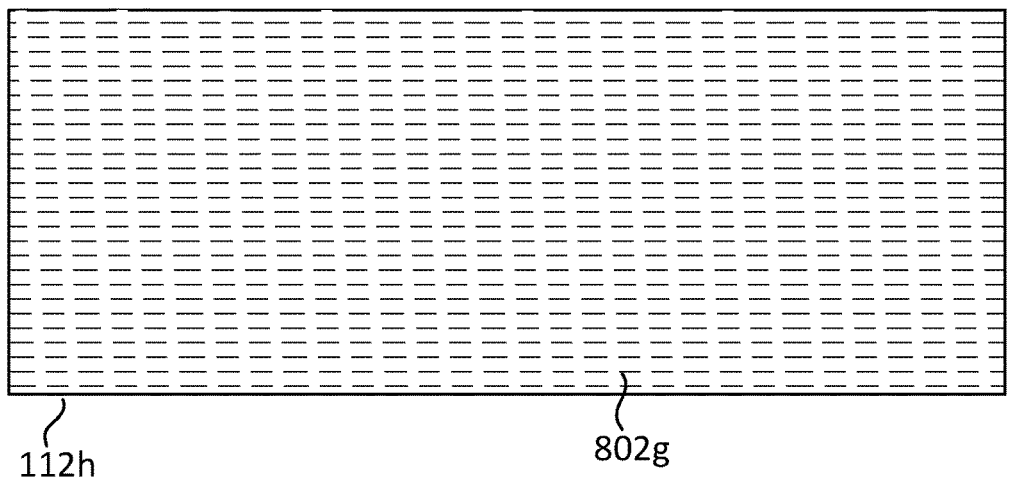

FIG. 13A to 13B respectively illustrate a temperature control roller 112 in various views according to various embodiments.

In view 1300*a*, the multiplicity of gas lines 112*g* are illustrated. Each gas line 112*g* of the multiplicity of gas lines 112*g* may for example be provided by means of a depression in the roller housing 112*h*.

In view 1300*b*, the multiplicity of circumferential channels 702*g* are illustrated. Each circumferential channel 702*g* of the multiplicity of circumferential channels 702*g* may for example be provided by means of a depression in the roller housing 112*h* and/or cross the gas lines 112*g*.

In view 1300*c*, the multiplicity of perforations 802*g* are illustrated. Each perforation 802*g* of the multiplicity of perforations 802*g* may for example be provided by means of a hollow cylinder over the roller housing 112*h* and/or be made to extend parallel to the gas lines 112*g*, for example crossing the circumferential channels 702*g*.

FIG. 14 illustrates a temperature control roller 112 according to various embodiments in a schematic layer structure diagram 1400a and a structure density diagram 1400b, in which the structure density 1041 (for example the pore density) is plotted against the radius 111r. The layers may for example be understood as layers in the form of hollow cylinders, which may be arranged one over the other with respect to the axis of rotation 111d, i.e. have an increasing radius 111r. The layers may for example be in contact with one another in pairs.

The cooling device 1124 may be arranged inside the temperature control roller 112. The lowermost layer 1402, lying thereover, may have the multiplicity of gas lines 112g. The second gas distributing layer 702, lying thereover, may be penetrated by a multiplicity of circumferential channels 702g and optionally the multiplicity of gas lines 112g. The third gas distributing layer 802, lying thereover, may be penetrated by a multiplicity of perforations 802g. The first gas distributing layer 602, lying thereover, may be penetrated by a multiplicity of pores connected to gas channels 602g. The temperature control surface of the roller shell 112m, lying thereover, may have the multiplicity of gas outlet openings 112o, which optionally penetrate the roller shell 112m in the form of a multiplicity of pores connected to gas channels. The multiplicity of gas outlet openings 112o may optionally be formed by means of the multiplicity of pores connected to gas channels 602g.

For example, the roller shell 112m may be microporous and the first gas distributing layer 602 may be mesoporous. As an alternative, the roller shell 112m may be mesoporous and the first gas distributing layer 602 may be macroporous.

Figure 15:
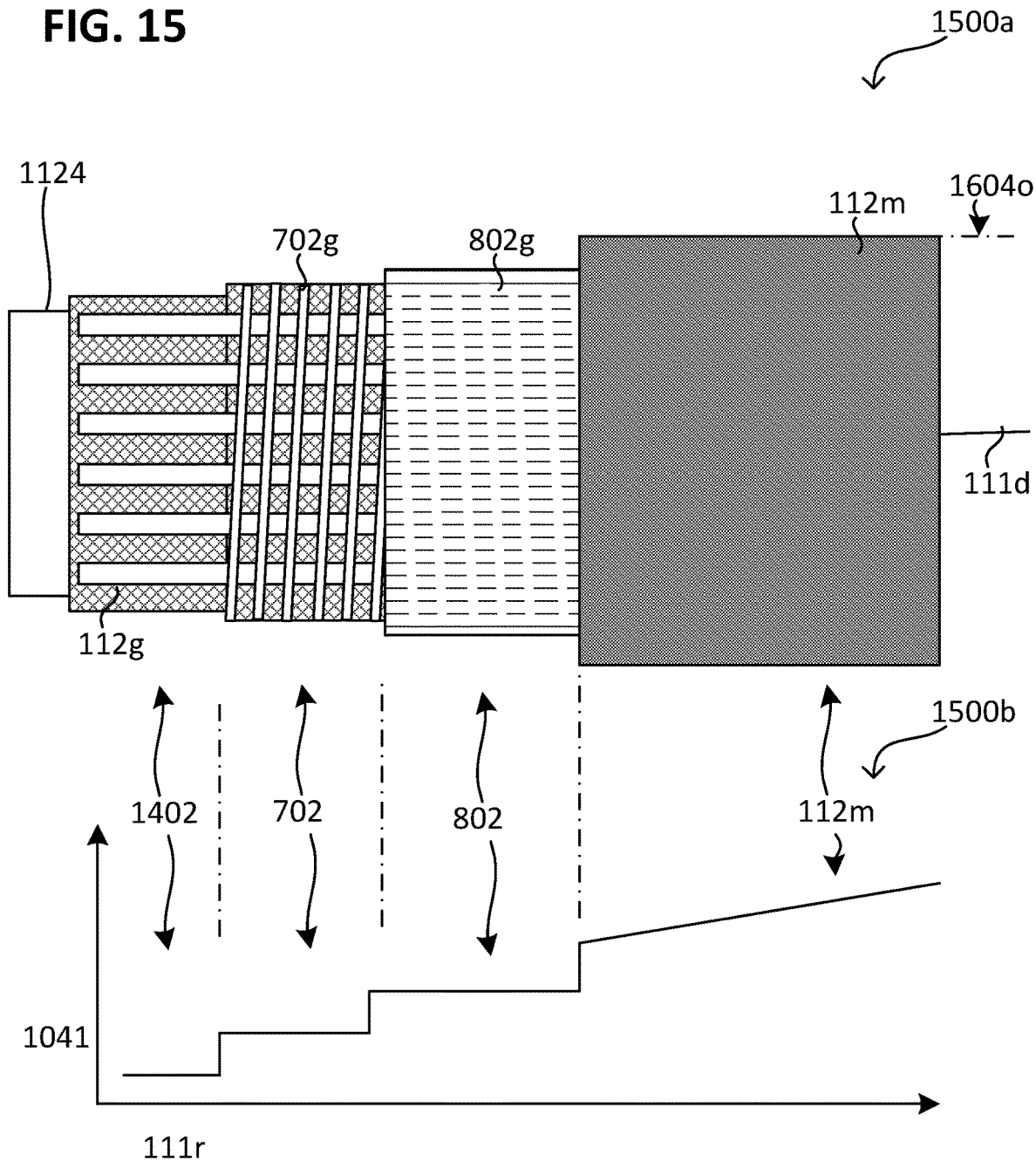

FIG. 15 illustrates a temperature control roller 112 according to various embodiments in a schematic layer structure diagram 1500a and a structure density diagram 1500b, in a way similar to FIG. 14, with the difference that the roller shell 112m has a gradient in the pore density 1041 and optionally the first gas distributing layer 602 is omitted. As a difference from the layers lying thereunder, the roller shell 112m may have a gradient in the structure density, whereas the structure density of the layers lying thereunder for example assumes discrete values.

Figure 16A:
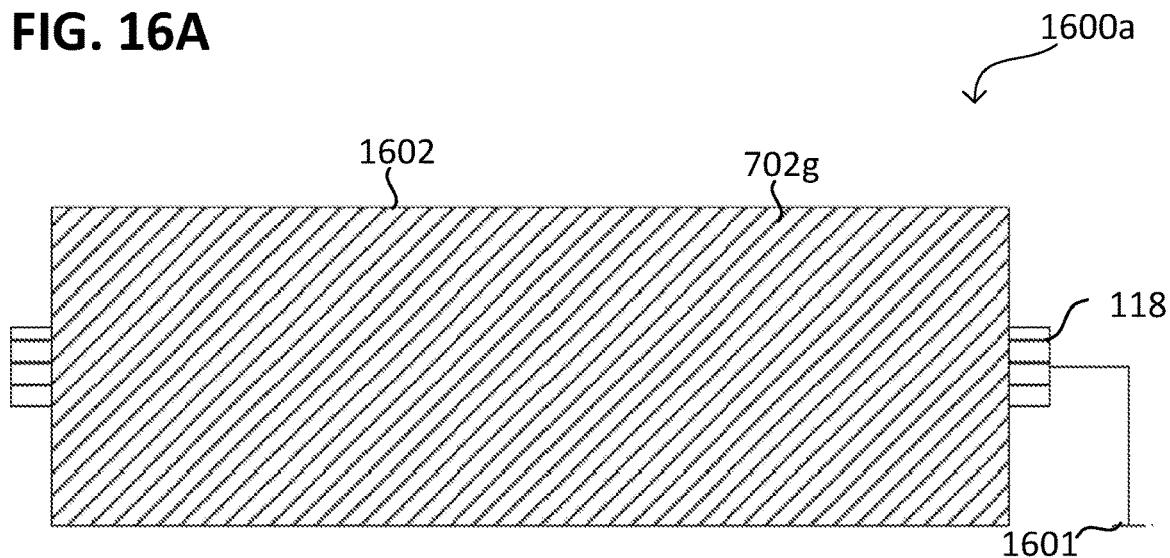
FIGS. 16A, 16B, 16C and 17 respectively show a temperature control roller according to various embodiments in various views.

FIG. 16A illustrates a temperature control roller 112 according to various embodiments in a schematic layer structure diagram 1600a. The temperature control roller 112 may have one or more than one electrically conductive (hollow-cylindrical) layer 1602 (also referred to as conducting layer 1602). The one or more than one conducting layer 1602 may be the lowermost layer 1402 and/or the second gas distributing layer 702 and/or the third gas distributing layer 802 and/or include or be formed by the first gas distributing layer 602.

The one or more than one conducting layer 1602 may for example have the multiple spiral circumferential channels 702g.

In a first operating mode (also referred to as neutral mode), a reference potential may be applied to the one or more than one conducting layer 1602. The reference potential may for example be electrical mass or the electrical potential of the substrate. As an alternative or in addition, the reference potential may be applied to the substrate. In the first operating mode, for example there may not be any electrostatic force of attraction provided between the substrate and the temperature control roller 112.

Figure 16B:
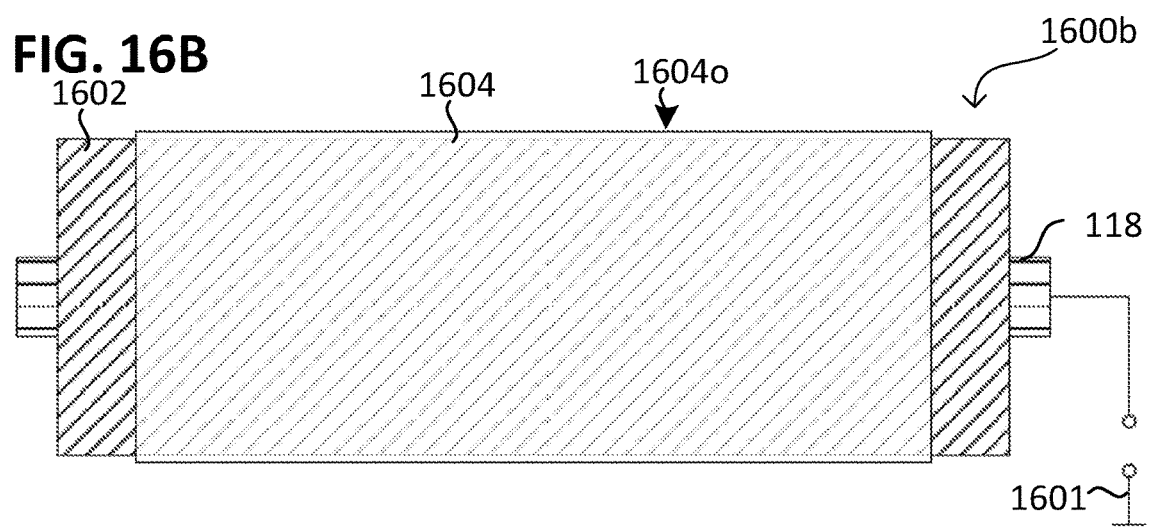

FIG. 16B illustrates a temperature control roller 112 according to various embodiments in a schematic layer structure diagram 1600b.

The temperature control roller 112 may have one or more than one electrically insulating (cylindrical) layer 1604 (also referred to as insulating layer 1604). The insulating layer 1604 may be an outermost, exposed layer (also referred to as terminating layer) of the temperature control roller and/or have the temperature control surface, for example the roller shell 112m.

For example, a breakdown voltage of the insulating layer 1604 may be more than 1000 volts (V), for example more than approximately 2000 V, or more than 3000 volts (V).

The one or more than one insulating layer 1604 may be arranged over the one or more than one conducting layer 1602. The one or more than one insulating layer 1604 may be configured to separate a substrate transported by means of the temperature control roller 112 electrically (for example galvanically) from the one or more than one conducting layer 1602.

The one or more than one insulating layer 1604 may include or be formed by the temperature control surface 1604o of the temperature control roller 112. The one or more than one insulating layer 1604 may for example have the roller shell 112m and optionally the third gas distributing layer 802 and/or optionally the first gas distributing layer 602.

In a second operating mode (also referred to as attraction mode), an electrical potential different from the reference potential, for example more than 10 volts (V), for example more than 20 V, for example more than 50 V, for example more than 100 V, may be applied to the one or more than one conducting layer 1602. The voltage given may represent (e.g., be based on) the reference potential.

As an alternative or in addition, the reference potential may be applied to the substrate.

In the second operating mode, for example an electrostatic force of attraction may be provided between the substrate and the temperature control roller 112, or at least a greater electrostatic force of attraction than in the first operating mode.

Figure 16C:
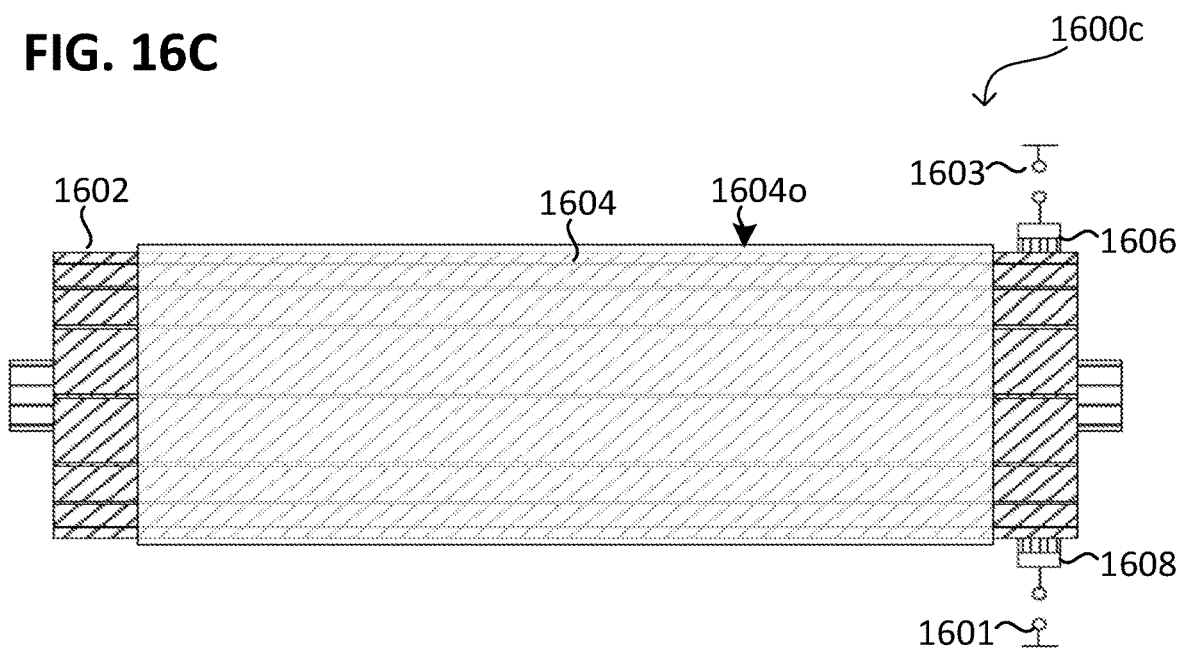

FIG. 16C illustrates a temperature control roller 112 according to various embodiments in a schematic layer structure diagram 1600c.

The temperature control roller 112 may be configured as in 1600b, with the difference that the conducting layer 1602 has multiple segments that are galvanically separated from one another. The segments of the conducting layer 1602 may for example be arranged next to one another along the circumference of the temperature control roller 112 and/or extend longitudinally along the axis of rotation of the temperature control roller 112.

The temperature control roller 112 may also have a first electrical contact 1606, which electrically contacts at least a first segment of the conducting layer 1602. The temperature control roller 112 may also have a second electrical contact 1608, which is at a distance from the first electrical contact 1606 along the circumference and/or electrically contacts at least one second segment of the conducting layer 1602.

For example, the first electrical contact 1606 and/or the second electrical contact 1608 may physically contact the conducting layer 1602 and/or be arranged on opposite sides.

In a third operating mode (also referred to as change mode), an electrical potential 1603 different from the reference potential, for example more than 10 volts (V), for example more than 20 V, for example more than 50 V, for example more than 100 V, may be applied to the first electrical contact 1606. In the third operating mode, furthermore, the reference potential 1601, or at least the electrical potential of the substrate, may be applied to the second electrical contact 1606. In other words, the first electrical contact 1606 may be activated according to the attraction mode and the second electrical contact 1608 may be activated according to the neutral mode.

More generally speaking, multiple electrical contacts 1606, 1608 may be provided, each contact of which is connected in an electrically conductive manner to a segment of the temperature control roller.

Optionally, the transporting arrangement may have a control device, which may control an electrical potential lying at each contact of the multiple electrical contacts 1606, 1608 in an open-loop and/or closed-loop manner, for example separately from one another. In this way, the spatial distribution of the electrostatic force of attraction of the substrate may be controlled in an open-loop and/or closed-loop manner. The open-loop and/or closed-loop control may for example take place on the basis of a parameter that represents a gas pressure between the substrate and the temperature control roller 112.

The change mode may for example include: applying a reference potential to a substrate; transporting the substrate by means of the temperature control roller 112, the substrate being completely in physical contact with a first portion of the temperature control roller 112 and partially in physical contact with a second portion of the temperature control roller 112 (for example is detached); applying the reference potential to the second portion and applying an electrical potential different from the reference potential to the first portion, the reference potential having a smaller potential difference from the substrate than the electrical potential different from the reference potential.

For example, the first electrical contact 1606 and/or the second electrical contact 1608 may include a sliding contact, for example a brush contact.

A flexible substrate, such as for example a film or a strip, may be cooled by means of the physical contact with the temperature control roller 112 (also referred to as cooling roller). In this case, the heat transfer between the substrate and the temperature control roller 112 (also referred to as cooling drum) may increase the heat output that may be carried away. For example, by way of illustration, the heat transfer may be particularly high as a result of the heat transport in a gas cushion between the substrate and the temperature control roller 112, it being possible for example to achieve over 100 W/m$^2$/K to 1000 W/m$^2$/K. The heat transfer increases with increasing gas pressure of the gas cushion between the substrate and the temperature control roller 112 and/or with a reduction in the distance between the substrate and the temperature control roller 112. A high gas pressure between the substrate and the temperature control roller 112 may be maintained by the substrate supply (either from the substrate itself or by corresponding enrichment on the substrate surface). For example, the gas may be introduced through the temperature control roller 112 itself into the interspace between the substrate and the temperature control roller 112. At a maximum, the gas pressure between the substrate and the temperature control roller 112 may for example be of such a magnitude that it does not lift off the substrate from the temperature control roller 112, the lifting of the substrate being counteracted by the pressing pressure that is built up for example by the strip tension. As an alternative or in addition, a substrate (for example a plastic film) may be drawn onto the temperature control roller 112 by means of electrostatic attraction, which may be used in particular in the case of electron beam evaporation. If, however, this electrostatic attraction is set too great, the detachment of the substrate from the temperature control roller 112 may be made more difficult. In particular when using electron beams for evaporation, various devices for discharging the substrate (also referred to as discharging devices) may be used, in order to counteract any charging of the substrate that may be caused by the coating process by means of the electron beam. By way of illustration, the electrical charge introduced into the substrate may be removed by means of the discharging device, in order for example to bring and/or keep the substrate to or at reference potential.

For example, a temperature control roller 112, which has a metallic temperature control surface 1604o (for example of chromium plated steel), may provide no or only insufficient electrostatic attraction, for example in relation to a metal film or a metallically coated film (when for example the coated side lies against the temperature control roller 112), since then the electrical charge may be dissipated and/or shielded. By means of the conducting layer 1602, an electrostatic force that presses the substrate against the temperature control roller 112 may be exerted on the substrate. By way of illustration, the electrostatic force may be transmitted by means of an electrode (the conducting layer 1602) that is insulated from the substrate.

According to various embodiments, a temperature control roller 112 that combines gas cooling and electrostatic attraction may be provided for applications in a vacuum, it optionally being possible for the strength of the electrostatic attraction and/or the location of the electrostatic attraction to be controlled in an open-loop and/or closed-loop manner.

According to various embodiments, the temperature control roller 112 may be perforated or open to diffusion at its temperature control surface 1604o, in order that gas from the temperature control roller 112 may leave the temperature control roller 112 into the interspace between the substrate and the temperature control roller 112. The temperature control surface 1604o of the temperature control roller 112 (for example an outer surface 16040) may for example be produced from an electrically insulating material. The conducting layer 1602 may be arranged under the electrically insulated temperature control surface 1604o of the temperature control roller 112.

The conducting layer 1602 may either be brought directly to a specified electrical potential by means of the shaft 118 of the temperature control roller 112 (for example if the temperature control roller 112 is mounted in an electrically insulated manner). In other words, the electrical potential may be coupled in at the shaft 118 of the temperature control roller 112. As an alternative, the conducting layer 1602 may be electrically insulated with respect to the shaft 118 of the temperature control roller 112, so that the electrical potential may be coupled in directly at the conducting layer 1602.

Optionally, the structure of the conducting layer 1602 and the coupling of the electrical potential into the conducting layer 1602 may be configured in such a way that the highest force of attraction is transmitted to the substrate in the region of the heat input (for example at the coating window) and a lower force of attraction is transmitted to the substrate in the region of the detachment of the substrate from the temperature control roller 112.

In this way it may be achieved that a high gas pressure may be provided, with at the same time a narrow gap between the substrate and the temperature control roller 112, and at the same time a reduced attraction is provided in the regions of the supply and removal of the substrate, with less of an adverse effect on substrate guidance.

The electrostatic force of attraction is provided for example by means of applying a voltage between the substrate and the conducting layer 1602. The gas-permeable and electrically insulating outer layer 1604 of the temperature control roller 112 may have for example a thickness of less than approximately 5 millimeters (mm), for example of less than approximately 2.5 mm, for example of less than approximately 1 mm.

In a first configuration, in the attraction mode, the coupling of the electrical voltage (for example with respect to the reference potential) into the conducting layer 1602 may for example take place by means of the roller housing 112*h* and/or the shaft 118.

For example, the coupling in may take place in an open-loop and/or closed-loop controlled manner, so that by way of illustration a compromise is provided between the highest possible force of attraction in the region of the coating window and a sufficient force of detachment for the detachment of the substrate from the temperature control roller 112.

For example, the coupling in (for example the value of the voltage) may take place in an open-loop and/or closed-loop controlled manner on the basis of a parameter that represents an operating point at which the substrate is processed. The operating point may for example be defined by the force of detachment.

For example, the force of detachment may be sensed, and in this way the maximum possible force of attraction for the substrate may be determined. By way of illustration, the force of attraction limits the maximum possible gas pressure that may be built up in the interspace between the substrate and the temperature control roller 112.

For the change mode, in a second configuration, the conducting layer 1602 may be electrically insulated with respect to the roller housing 112*h* and/or the shaft 118. For example, the conducting layer 1602 may be applied in such a way that it may be contacted on the outer side of the temperature control roller 112 (for example with graphite brushes or other sliding contacts). By electrical charging directly before/in the coating window and electrical discharging at the region of the substrate detachment, a spatial distribution of the force of attraction may be provided. The spatial distribution of the electrical potential corresponding thereto that is coupled into the conducting layer 1602 may be provided for example by means of the multiple electrical contacts 1606, 1608.

For the changing mode, optionally, the conducting layer 1602 may be configured in such a way that the conducting layer 1602 has an anisotropic electrical conductivity. For example, the electrical conductivity parallel to the axis of rotation 111*d* (also referred to as transverse conductivity) may be greater than transverse to the axis of rotation 111*d*, for example along the transporting direction. The anisotropic electrical conductivity may be provided for example by means of separating the conducting layer into strip segments.

In this way, a first force of attraction may be transmitted to the substrate in a first angular region of the temperature control roller 112 and a second force of attraction, which is lower than the first force of attraction, may be transmitted to the substrate in a second angular region. The maximum achievable first force of attraction, and consequently for example the maximum possible gas pressure in the interspace between the temperature control roller 112 and the substrate, may for example be limited only by the breakdown voltage (also referred to as puncture voltage) of the insulating layer 1604. The detachment behavior is in this case independent of which value is used for the first force of attraction.

Figure 17:
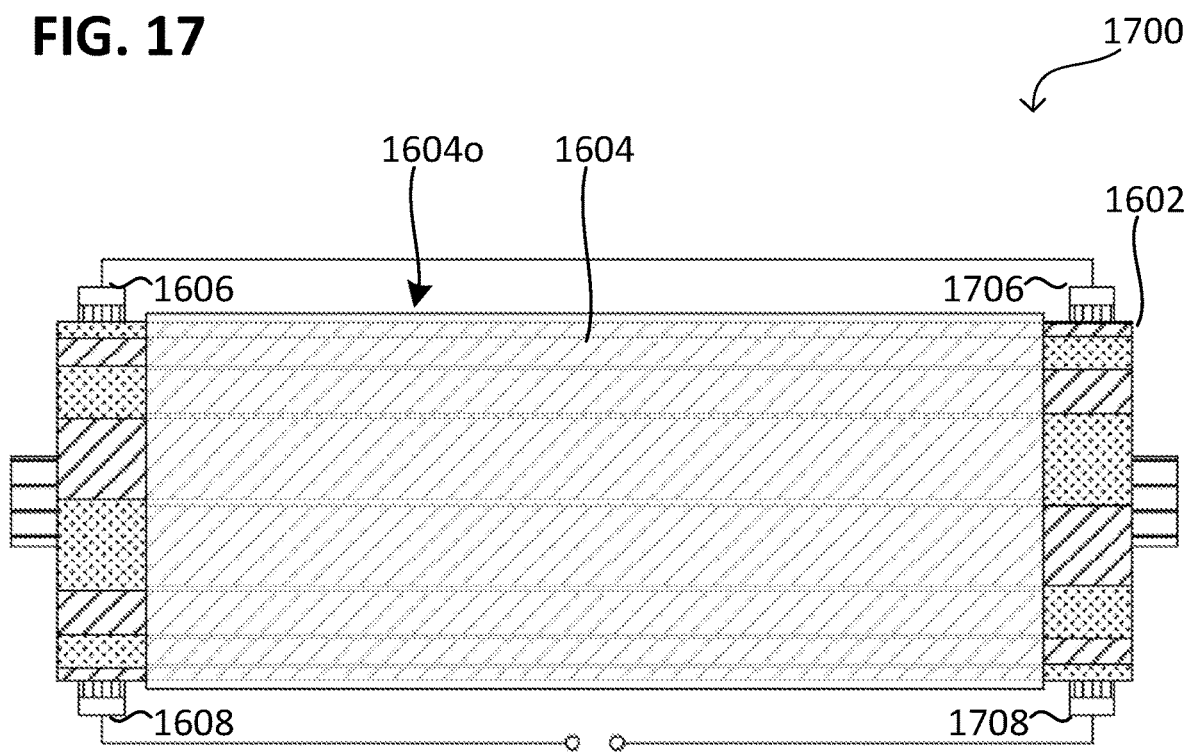

FIG. 17 illustrates a temperature control roller 112 according to various embodiments in a schematic layer structure diagram 1700, which is for example configured as in the layer structure diagram 1600*c*.

For the changing mode, in a third configuration of the conducting layer 1602, alternately different electrical potentials may be coupled in, for example in an alternating manner.

For example, the first configuration and the second configuration may meet their limit if the substrate is not sufficiently grounded or the substrate grounding has adverse effects on the result of the process. In order to overcome this limit, the temperature control roller 112 may be contacted in such a way that, as the temperature control roller 112 turns, its segments are alternately contacted on opposite sides, for example by means of multiple contacts 1606, 1608, 1706, 1708, of which one or more than one first contact 1606, 1608 is arranged on a first side of the temperature control roller 112 and one or more than one second contact 1706, 1708 is arranged on a second side of the temperature control roller 112 that is opposite from the first side (along the axis of rotation 111*d*). For example, a first segment of the conducting layer 1602 may be electrically contacted on the first side and a second segment, directly adjacent to the first segment, of the conducting layer 1602 may be electrically contacted on the second side.

The segments (for example strips) of the conducting layer 1602 may be configured as electrically insulated from one another, for example galvanically separated from one another. For example, they may be separated from one another in the same plane or be separated from one another in different planes by means of an insulating separating layer.

Apart from a strip form, one or more than one (for example each) segment of the conducting layer 1602 may also be differently formed, for example in the form of a meander, the form of a wedge and/or in such a way that the temperature control surface 1604*o* is filled to a maximum extent.

By analogy with the second configuration, the contacting of the conducting layer 1602 may take place on the outer sides of the temperature control roller 112, for example in the region of the coating window, and in the same way the charge balance (i.e. the discharging of the conducting layer 1602) may take place in the region of the substrate supply and removal.

In a fourth configuration, the insulating layer 1604 (for example an outer insulating layer) may be produced from a material which allows the insulating layer 1604 to be easily exchanged. For example, the insulating layer 1604 may include a perforated shrink film, a lacquer open to diffusion or some other coating open to diffusion, for example vapor-deposited ZrO (zirconium oxide). For maintenance of the temperature control roller 112, a maintenance device may for example be provided, providing a (for example uniform) removal and subsequent re-application of the insulating layer 1604.

By means of the temperature control roller 112 provided herein, an increase and/or enablement of the heat transfer at the temperature control roller 112 may be provided by defined pressing by means of electrostatic forces and at the same time a flow of gas out of the temperature control roller 112 into the gap between the substrate and the temperature control roller 112.

Figure 18:
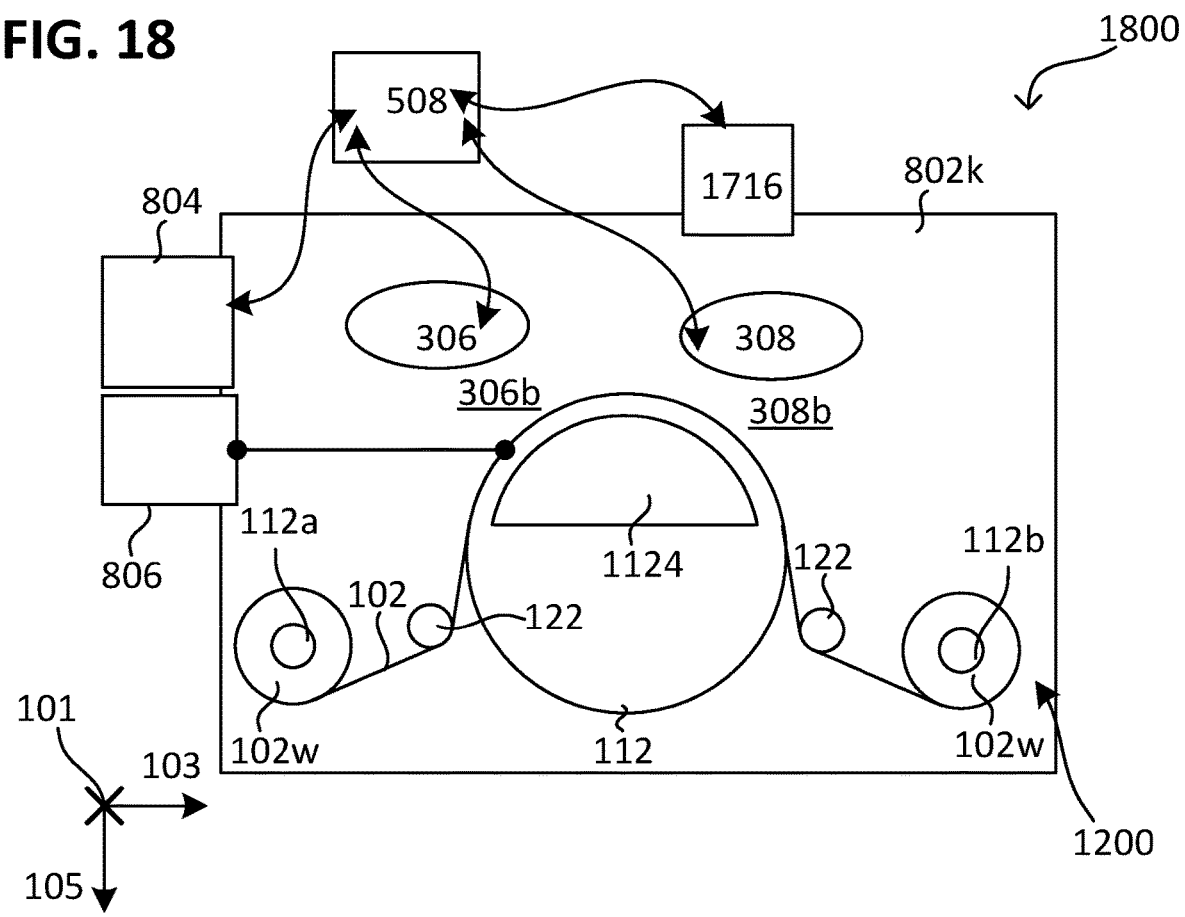
FIG. 18 shows a vacuum arrangement according to various embodiments in a schematic side view or cross-sectional view.

FIG. 18 illustrates a vacuum arrangement 1800 according to various embodiments in a schematic side view or cross-sectional view (with the viewing direction along the axis of rotation 111*d*), the vacuum arrangement 1800 having the transporting arrangement 1200 or alternatively one of the transporting arrangements 100, 200, 300 or 1000, which has the temperature control roller 112.

According to various embodiments, circulatory winding and/or processing (for example coating) of the substrate 102 may take place in a vacuum, for example in a vacuum arrangement 1800.

According to various embodiments, the vacuum arrangement 1800 may have a vacuum chamber housing 802k, in which a vacuum may be generated and/or maintained. The vacuum chamber housing 802k may for this purpose be configured for example as air-tight, dust-tight and/or vacuum-tight. The vacuum chamber housing 802k may have one or more vacuum chambers. The or each vacuum chamber may provide one or more vacuum regions 306b, 308b, for example processing regions 306b, 308b. The multiple vacuum chambers and/or the multiple vacuum regions 306b, 308b of the vacuum chamber housing 802k may optionally be at least partially gas-separated from one another.

Furthermore, the vacuum chamber housing 802k may be coupled to a pump system 804 (having at least one low vacuum pump and optionally at least one high vacuum pump). The pump system 804 may be configured to extract a gas (for example the process gas) from the vacuum chamber housing 802k, so that a vacuum (i.e. a pressure less than 0.3 bar) and/or a pressure in a range from approximately 1 mbar to approximately $10^{-3}$ mbar (in other words a fine vacuum) and/or a pressure in a range from approximately $10^{-3}$ mbar to approximately $10^{-7}$ mbar (in other words a high vacuum) or a pressure of less than a high vacuum, for example less than approximately $10^{-7}$ mbar (in other words an ultrahigh vacuum) may be provided within the vacuum chamber housing 802k.

The pump system 804 may for example include or be formed by the pump arrangement 1716. As an alternative or in addition, the vacuum arrangement 1800 may have a gas supplying arrangement 1716. By means of the gas supplying arrangement 1716, a process gas may be fed to the vacuum chamber housing 802k to form a process atmosphere in the vacuum chamber housing 802k. The process gas may for example include or be formed by an inert gas. As an alternative or in addition, the process gas may include or be formed by a reactive gas, for example oxygen, nitrogen, hydrogen, argon and/or carbon. The process pressure may be formed by an equilibrium of process gas that is fed by means of the gas supplying arrangement 1716 and is extracted by means of the pump system 804.

Furthermore, the vacuum chamber housing 802k may be configured in such a way that the operating point (for example the vacuum conditions or more generally the process conditions) under which the substrate is processed (for example, process pressure, process temperature, chemical process gas composition, electrostatic force of attraction, etc.) may be adjusted or controlled (for example locally), for example by means of a control device 508. For example, multiple vacuum regions 306b, 308b with operating points that are different from one another may be provided by means of the vacuum chamber housing 802k. For example, the control device 508 may be configured for controlling a voltage supply 806, the gas supplying arrangement 1716 and/or the pump system 804 in an open-loop and/or closed-loop manner. By means of the voltage supply 806, for example an electrical potential may be provided for the temperature control roller 112 (for example gas distributing structure 402). For example, the control device 508 may be configured for open-loop and/or closed-loop control of the electrical potential that is coupled in to the temperature control roller 112 (for example the gas distributing structure 402) and/or the resultant force of attraction that is transmitted to the substrate 102. As an alternative or in addition, the control device 508 may be configured for open-loop and/or closed-loop control of a standard volumetric flow of process gas, which is fed by means of the gas supplying arrangement 1716 and/or the temperature control roller 112 and/or is extracted by means of the pump system 804.

According to various embodiments, the control device 508 may be configured for open-loop and/or closed-loop control of an optional temperature control device 1124 (for example having a heating device and/or a cooling device), so that a process temperature (for example of the substrate 102 and/or of the process gas), may be controlled in an open-loop and/or closed-loop manner, for example during the processing (for example during the coating). For example, the control device 508 may be configured for open-loop and/or closed-loop control of a thermal output, which is fed by means of the substrate temperature control device 1124 and/or extracted by means of it.

Optionally, the vacuum arrangement 1800 may have a supply device for supplying to the temperature control device 1124, for example for supplying a temperature-controlled fluid (for example a cooling liquid) or electrical energy. For example, the supply device may be arranged outside the processing chamber 802k. For example, a heating medium or a cooling medium may be fed to the temperature control device 1124 (for example the temperature control roller 112) and removed from it again.

At least one vacuum region 306b, 308b, for example a first vacuum region 306b, may be arranged in the vacuum chamber housing 802k (for example in a first vacuum chamber). Furthermore, a first processing source 306, for example a coating material source 306, may be arranged in the vacuum chamber housing 802k (for example in the first vacuum chamber). The coating material source 306 may be configured for emitting a gaseous coating material into the first vacuum region 306b. With the coating material, the substrate 102 may be coated. In other words, the coating of the substrate 102 may take place in the first vacuum region 306b. The first vacuum region 306b may be a coating region 306b.

Optionally, at least one second vacuum region 308b may be arranged in the vacuum chamber housing 802k (for example in a second vacuum chamber or in the first vacuum chamber). Furthermore, a second processing source 308, for example a light-exposure device 308, may be arranged in the vacuum chamber housing 802k (for example in the second vacuum chamber). The second processing source 308 may for example be configured for working and/or coating the coating material with which the substrate 102 is coated.

According to various embodiments, the vacuum chamber housing 802k may have a chamber opening for exposing the interior of the vacuum chamber housing 802k. The chamber opening may expose the interior of the vacuum chamber housing 802k for example in the direction of the axis of rotation 111d. For closing the chamber opening, the vacuum chamber housing 802k may have a chamber cover.

According to various embodiments, the control device 508 may be configured for open-loop and/or closed-loop control of the first processing source 306 and/or the second processing source 308, for example in that the latter controls in an open-loop and/or closed-loop manner an amount of material and/or thermal energy (for example radiation energy) that is emitted per unit of time in the direction 105 of the substrate 102.

Furthermore, the vacuum arrangement 1800 may have one or more than one temperature control roller 112 (for example gas cooling roller 112) and optionally one or more than one guide roller 122, which define a transporting path 111 along which the substrate 102 (for example a substrate in strip form) is transported between the unwinding roller 112*a*, 112*b* and the winding-up roller 112*b* through the at least one vacuum region 306*b*, 308*b*, for example in a transporting direction 111*w* (which may be perpendicular to the axis of rotation 111*d*). The guide roller 122 may be configured to deflect the transporting path.

Optionally, a cleaning of the temperature control roller 112 may take place, in that a contaminant (for example a parasitically deposited metal) is removed from the roller shell 112*m* (by means of atomizing), for example by means of a sputtering device. Optionally, the sputtering device may be provided in that the temperature control roller 112 is configured as a sputtering cathode. For this purpose, an electrical sputtering potential, by means of which a plasma may be generated, may be applied to the temperature control roller 112, for example its conducting layer 1602. In other words, the plasma may be supplied with electrical energy, which is fed by means of the temperature control roller 112. If the vacuum arrangement 1800 does not have a sputtering device, one of the processing sources (for example its evaporation crucible) may be exchanged for the sputtering device.

For the sputtering, a plasma-forming gas may be ionized by means of the sputtering cathode, it being possible by means of the plasma thereby formed for a material (for example contaminants) to be removed from the temperature control roller 112 (for example atomized). The atomized material may subsequently be removed from the vacuum chamber. Atomized material settles on substrates possibly lying ready during the cleaning or in the area surrounding the process (internal sheet-metal components). By means of sputtering, for example, a layer or multiple layers may be removed from the temperature control roller 112. As an alternative or in addition, by means of sputtering, the roller shell 112*m* of the temperature control roller 112 (for example its pores) may be exposed. As an alternative or in addition, by means of sputtering, a structure density of the temperature control roller 112 (for example its roller shell 112*m*) may be increased, for example in that blocked pores are opened.

There follows a description of various examples that relate to what has been described above and is shown in the figures.

Example 1 is a temperature control roller 112, having: a cylindrical (for example hollow-cylindrical) roller shell 112*m*, which has a multiplicity of gas outlet openings 112*o*; a temperature control device 1124 (for example cooling device), which is configured to supply and/or extract thermal energy to or from the roller shell 112*m*; multiple gas lines 112*g* made to extend along the axis of rotation; a gas distributing structure 402, which couples the multiple gas lines 112*g* and the multiplicity of gas outlet openings 112*o* to one another in a gas-conducting manner, the gas distributing structure 402 having a lower structure density 1041 and/or greater electrical conductivity than the roller shell 112*m*, optionally the gas distributing structure 402 being electrically insulated (for example galvanically separated) by means of the roller shell 112*m* (for example in a radial direction and/or from a substrate lying on the temperature control roller 112), the temperature control roller 112 optionally also having: a heat distributing layer 451, which is arranged between the gas distributing structure 402 and the multiple gas lines 112*g*, the heat distributing layer 451 having a greater thermal conductivity than the gas distributing structure 402 and/or a material of the temperature control roller 112 in which the multiple gas lines 112*g* are formed, the heat distributing layer 451 for example including or being formed by copper.

Example 2 is the temperature control roller 112 according to Example 1, the gas distributing structure 402 coupling the multiplicity of gas outlet openings 112*o* to one another in a gas-conducting manner, and/or the gas distributing structure 402 coupling the multiple gas lines 112*g* to one another in a gas-conducting manner.

Example 3 is the temperature control roller 112 according to Example 1 or 2, the structure density 1041 represents (e.g., being based on) a cylindrical surface area (for example in the form of a cylinder casing) and/or on gas-conductive openings (i.e. the gas conducting structure density), for example on gas-through-conductive openings.

Example 4 is the temperature control roller 112 according to one of Examples 1 to 3, the gas outlet openings being provided by means of a multiplicity of interconnected pores, which the structure density 1041 represents, e.g., on which the structure density 1041 is based.

Example 5 is the temperature control roller 112 according to one of Examples 1 to 4, the structure density 1041 of the roller shell 112*m* represents (e.g., being based on) the area density of the gas outlet openings.

Example 6 is the temperature control roller 112 according to one of Examples 1 to 5, the gas distributing structure 402 having a (for example hollow-cylindrical) porous layer, which (for example its pore area density) are represented by the structure density 1041 of the gas distributing structure 402 and/or which is physically in contact with the roller shell 112*m*, e.g., on which (for example its pore area density) the structure density 1041 of the gas distributing structure 402 is based and/or which is physically in contact with the roller shell 112*m*.

Example 7 is the temperature control roller 112 according to Example 6, the structure density 1041 being a pore area density.

Example 8 is the temperature control roller 112 according to Example 6 or 7, the porous layer and the multiplicity of gas outlet openings (for example the network of interconnected pores) differing in at least one of the following properties: a spatial pore density; a spatial pore size; and/or a porosity.

Example 9 is the temperature control roller 112 according to one of Examples 6 to 8, the porous layer being configured as electrically conductive or including or being formed by at least one electrically conductive material.

Example 10 is the temperature control roller 112 according to one of Examples 1 to 9, the gas distributing structure 402 (for example its porous layer) having a greater electrical conductivity than the roller shell 112*m*.

Example 11 is the temperature control roller 112 according to one of Examples 1 to 10, the gas distributing structure 402 having multiple (for example hollow-cylindrical) layers, which differ in their structure density 1041.

Example 12 is the temperature control roller 112 according to one of Examples 1 to 11, the gas distributing structure 402 having multiple circumferential channels 702*g*, each circumferential channel of which couples the multiple gas lines 112*g* to one another in a gas-conducting manner and/or which are represented by the structure density 1041, e.g., on which the structure density 1041 is based.

Example 13 is the temperature control roller 112 according to Example 12, each circumferential channel of the multiple circumferential channels 702*g* being made to extend longitudinally around the axis of rotation.

Example 14 is the temperature control roller 112 according to Example 12 or 13, one or more of the multiple circumferential channels 702g being made to extend as a circumferential channel along a circular arc.

Example 15 is the temperature control roller 112 according to one of Examples 12 to 14, the multiple gas lines 112g and the multiple circumferential channels 702g crossing one another and/or running obliquely in relation to one another.

Example 16 is the temperature control roller 112 according to one of Examples 12 to 15, each circumferential channel of the multiple circumferential channels 702g being coupled in a gas-conducting manner to all of the gas lines 112g of the multiple gas lines 112g.

Example 17 is the temperature control roller 112 according to one of Examples 12 to 16, one or more of the multiple circumferential channels 702g being made to extend as a circumferential channel along a helix.

Example 18 is the temperature control roller 112 according to Example 17, circumferential channels that adjoin one another of the multiple circumferential channels 702g being made to extend along a common helix.

Example 19 is the temperature control roller 112 according to one of Examples 1 to 18, the gas distributing structure 402 having a gas distributing layer 802 (for example a plate, for example a metal sheet and/or a perforated plate), which is penetrated by a multiplicity of perforations (for example oblong holes or slits), which are represented by the structure density 1041 (e.g., on which the structure density 1041 is based); for example, the gas distributing layer 802 (for example a meshwork) including a multiplicity of filaments, between which the multiplicity of perforations are provided, the gas distributing layer 802 being for example at least partially (i.e. partially or completely) arranged within the multiple circumferential channels 702g and/or multiple gas lines 112g, the gas distributing structure 402 having as an alternative or in addition to the gas distributing layer 802 an adhesion promoter layer 802, the adhesion promoter layer 802 for example being granular and/or porous, the adhesion promoter layer 802 for example including or being formed by nickel and/or aluminum.

Example 20 is the temperature control roller 112 according to one of Examples 1 to 19, the cylindrical roller shell 112m having a network of interconnected pores, which provide the multiplicity of gas outlet openings 112o; the gas distributing structure 402 having a greater structure density 1041 than the network of interconnected pores.

Example 21 is the temperature control roller 112 according to one of Examples 1 to 20, the roller shell 112m having (for example along a direction transverse to the axis of rotation) a gradient in the structure density 1041.

Example 22 is the temperature control roller 112 according to one of Examples 1 to 21, the roller shell 112m having (for example along a direction transverse to the axis of rotation) a gradient in at least one of the following properties: a spatial pore density; a spatial pore size; and/or a porosity.

Example 23 is the temperature control roller 112 according to one of Examples 1 to 22, the gas distributing structure 402 having a greater structure density 1041 than the multiple gas lines 112g.

Example 24 is the temperature control roller 112 according to one of Examples 1 to 23, the gas distributing structure 402 having a greater linear structure density 1041 along the axis of rotation than the multiple gas lines 112g.

Example 25 is the temperature control roller 112 according to one of Examples 1 to 24, the gas distributing structure 402 having a lower structure linear density 1041 along the axis of rotation than the multiplicity of gas outlet openings 112o.

Example 26 is the temperature control roller 112 according to one of Examples 1 to 25, the gas distributing structure 402 having a greater structure linear density 1041 transverse to the axis of rotation (for example in a circumferential direction) than the multiplicity of gas outlet openings 112o.

Example 27 is the temperature control roller 112 according to one of Examples 1 to 26, also having: multiple gas connections, each gas connection of which is coupled in a gas-conducting manner to precisely one gas line 112g of the multiple gas lines 112g.

Example 28 is the temperature control roller 112 according to one of Examples 1 to 27, the temperature control device 1124 having: a cylindrical (for example double-walled) housing, which has a cavity (for example provided by means of a double-walled housing wall) for receiving a temperature control fluid (for example cooling fluid), the gas distributing structure 402 being arranged for example between the housing and the roller shell 112m.

Example 29 is the temperature control roller 112 according to one of Examples 1 to 28, the temperature control device 1124 also having: a temperature-control fluid connection for connecting to a temperature-control fluid supply (for example cooling fluid supply).

Example 30 is the temperature control roller 112 according to one of Examples 1 to 29, the roller shell 112m being configured as electrically insulating or at least including or being formed by an electrically insulating material (for example a dielectric).

Example 31 is the temperature control roller 112 according to one of Examples 1 to 30, the roller shell 112m providing an electrical breakdown voltage of more than 1000 volts (V).

Example 32 is the temperature control roller 112 according to one of Examples 1 to 31, also having: a contacting arrangement (e.g., including one or more contacts), which is connected in an electrically conductive manner to the gas distributing structure 402 for coupling an electrical potential into the gas distributing structure 402.

Example 33 is the temperature control roller 112 according to one of Examples 1 to 32, the gas distributing structure 402 having multiple segments that are electrically insulated from one another and electrically conductive.

Example 34 is the temperature control roller 112 according to one of Examples 1 to 33, the gas distributing structure 402 having an anisotropic electrical conductivity.

Example 35 is the temperature control roller 112 according to Example 34, the contacting arrangement having multiple electrical contacts, at least two contacts of the multiple electrical contacts being arranged on opposite sides of the temperature control roller 112; and/or at least two contacts of the multiple electrical contacts being at a distance from one another that is greater than an extent parallel thereto of the segments of the gas distributing structure 402.

Example 36 is the temperature control roller 112 according to Example 35, the at least two contacts differing in the segment to which they are coupled in an electrically conductive manner.

Example 37 is the temperature control roller 112 according to one of Examples 1 to 36, also having: a voltage source, which is configured to couple an electrical potential into the gas distributing structure 402.

Example 38 is the temperature control roller 112 according to Example 37, the voltage source having a control device, which is configured to control the electrical potential in an open-loop and/or closed-loop manner, for example on the basis of a parameter that represents an operating point at which a substrate is processed, the control device being configured for example to control a spatial distribution of the electrical potential in an open-loop and/or closed-loop manner.

Example 39 is the temperature control roller 112 according to Example 38, the parameter including or representing at least one of the following operating point parameters: a gas pressure between the substrate and the temperature control roller 112; a force that is required for detaching the substrate from the temperature control roller 112 (also referred to as force of detachment); a temperature of the substrate.

Example 40 is the temperature control roller 112 according to one of Examples 1 to 39, the roller shell 112*m* and/or the gas distributing structure 402 (for example its porous layer) including a multiplicity of solid particles (for example a granular material).

Example 41 is the temperature control roller 112 according to one of Examples 1 to 40, the gas distributing structure 402 (for example its porous layer and/or solid particles) including or being formed by a metal (for example aluminum).

Example 42 is the temperature control roller 112 according to one of Examples 1 to 41, the structure density of the roller shell 112*m* (for example along the circumference and/or the axis of rotation) being in a range from 200 mm approximately to approximately 2000 mm (or more); and/or the structure density of the first gas distributing layer 602 (for example along the circumference and/or the axis of rotation) being in a range from 10 mm approximately to approximately 100 mm, and/or the structure density (for example along the axis of rotation) of the circumferential channels being in a range from 0.1 mm approximately to approximately 0.5 mm (for example 0.25 mm), and/or the structure density of the perforations being in a range from 0.05 mm approximately to approximately 0.3 mm, and/or the structure density of the gas lines 112*g* (for example along the circumference) being in a range from 0.01 mm approximately to approximately 0.05 mm. For example, the roller outer tube 112*h* may have a circumferentially peripheral groove (for example similar to a thread groove), which provides the circumferential channels, for example with a pitch of approximately 5 mm or more, a depth of approximately 1 mm, and/or a flank angle of approximately 60°. As an alternative or in addition, the roller outer tube 112*h* may have multiple grooves that are made to extend in the axial direction (i.e. along the axis of rotation), which provide the gas lines 112*g*, for example with a width (extent transverse to the axis of rotation along the circumference) of approximately 4 mm and/or a depth of approximately 6 mm, or distributed approximately 40 in number (or between approximately 20 and approximately 80) over the circumference of the temperature control roller 112, for example equidistant from one another and/or every 9°. For example, a perforated shell 802, which has a multiplicity of slits (for example a slit arrangement) which provide the perforations, may be arranged on the roller outer tube (for example slipped-over), it being possible for each of these slits to have for example a length in the axial direction of approximately 10 mm and a width transverse thereto of approximately 0.3 mm, while slits that are directly adjacent to one another may be at a distance from one another in the axial direction and/or along the circumference of approximately 7 mm, and/or slits that are directly adjacent to one another (for example in rows made to extend axially, i.e. rows of slits following directly one after the other) are arranged offset from one another, for example in each case by approximately 8.5 mm (by way of illustration (10 mm length+7 mm distance)/2=8.5 mm). For example, a microporous coating, which may include a base layer, which provides the first gas distributing layer 602, and/or a top layer, which provides the roller shell 112*m*, may be applied. For example, the base layer may have a thickness of approximately 2 mm, include or be formed by aluminum, and/or have a porosity in a range from approximately 5% to approximately 25% (for example approximately 10%). For example, the top layer may have a thickness of approximately 0.5 mm or at least of less than the base layer. For example, the top layer may include or be formed by one or more than one oxide (for example aluminum oxide (for example $Al_2O_3$), chromium oxide, titanium oxide, yttrium oxide, and/or zirconium oxide (for example ZrO)).

Example 43 is the temperature control roller 112 according to one of Examples 1 to 42, the roller shell 112*m* (for example its porous layer and/or solid particles) including or being formed by a ceramic (for example zirconium oxide or aluminum oxide).

Example 44 is a temperature control roller 112, for example the temperature control roller 112 according to one of Examples 1 to 43, having: a cylindrical roller shell 112*m*, which defines an axis of rotation and has a network of interconnected pores, which provide a multiplicity of gas outlet openings 112*o*; a gas distributing structure 402, which has a gas connection for connecting a gas supply; a temperature control device 1124 (for example cooling device 1124), which is configured to supply and/or extract thermal energy to or from the cylindrical roller shell 112*m*; the gas distributing structure 402 having multiple circumferential channels 702*g* running transversely to the axis of rotation, which provide a gas-conducting connection between the multiple gas outlet openings 112*o* and the gas connection, or are at least part of this connection, and each circumferential channel 702*g* of which is made to extend longitudinally around the axis of rotation; the gas distributing structure 402 also having a porous layer, which provides a gas-conducting connection between the multiplicity of gas outlet openings 112*o* and the gas connection, or is at least part of the gas-conducting connection; the porous layer and the network of interconnected pores differing in at least one of the following properties: a spatial pore density; a spatial pore size; and/or a porosity.

Example 45 is the temperature control roller 112, for example the temperature control roller 112 according to one of Examples 1 to 44, having: a cylindrical roller shell 112*m*, which defines an axis of rotation and has a network of interconnected pores, which provide a multiplicity of gas outlet openings 112*o*; a gas distributing structure 402, which has a gas connection for connecting a gas supply; a temperature control device 1124 (for example cooling device 1124), which is configured to supply and/or extract thermal energy to or from the cylindrical roller shell 112*m*; the gas distributing structure 402 having a porous layer, which provides a gas-conducting connection between the multiplicity of gas outlet openings 112*o* and the gas connection, or is at least part of this connection; the porous layer and the network of interconnected pores differing in at least one of the following properties: a spatial pore density; a spatial pore size; and/or a porosity.

Example 46 is the temperature control roller 112, for example the temperature control roller 112 according to one of Examples 1 to 45, having: a cylindrical roller shell 112*m*, which defines an axis of rotation and has a network of interconnected pores, which provide a multiplicity of gas outlet openings 112o; a gas distributing structure 402, which has a gas connection for connecting a gas supply; a temperature control device 1124 (cooling device 1124), which is configured to supply and/or extract thermal energy to or from the cylindrical roller shell 112m; the network of interconnected pores having (for example along a direction transverse to the axis of rotation) a gradient in at least one of the following properties: a spatial pore density; a spatial pore size; and/or a porosity.

Example 47 is the temperature control roller 112, for example the temperature control roller 112 according to one of Examples 1 to 46, having: a cylindrical roller shell 112m, which defines an axis of rotation and has a multiplicity of gas outlet openings 112o; a gas distributing structure 402, which has a gas connection for connecting a gas supply; a temperature control device 1124 (for example cooling device 1124), which is configured to supply and/or extract thermal energy to or from the cylindrical roller shell 112m; the gas distributing structure 402 also having multiple circumferential channels 702g, which provide a gas-conducting connection of the multiple gas outlet openings 112o to the gas connection, or are at least part of this connection, and each circumferential channel 702g of which is made to extend longitudinally along a (for example closed or spiral) path around the axis of rotation.

Example 48 is a transporting arrangement, having: a temperature control roller 112 according to one of Examples 1 to 47, two circulatory winding rollers (for example an unwinding roller and a winding-up roller), which are configured to wind a substrate between them in a circulating manner; multiple optional transporting rollers 122, which jointly with the temperature control roller 112 provide a transporting path between the two circulatory winding rollers for winding the substrate in a circulating manner along the transporting path.

Example 49 is a vacuum arrangement, having: a transporting arrangement according to Example 48, a processing source for processing (for example a coating material source for coating) a substrate transported by means of the temperature control roller 112.

Example 50 is the vacuum arrangement according to Example 49, also having: a vacuum chamber, in which the temperature control roller 112 is arranged.

Example 51 is a method, including: winding a substrate in a circulating manner by means of a temperature control roller 112, for example the temperature control roller 112 according to one of Examples 1 to 50; introducing a gas between the temperature control roller 112 and the substrate; providing an electrical voltage between the temperature control roller 112 and the substrate for transmitting an electrostatic force of attraction to the substrate; optionally emitting a coating material in the direction of the temperature control roller 112 for coating the substrate with the coating material; optionally controlling the electrical voltage in an open-loop and/or closed-loop manner, for example on the basis of a parameter that represents an operating point at which a substrate is processed; the electrical voltage optionally being spatially distributed inhomogeneously; optionally extracting and/or supplying thermal energy from or to the substrate by means of the temperature control roller 112.

Example 52 is a method, including: setting up the temperature control roller 112 as a sputtering cathode, for example coupling an electrical sputtering potential (for example for generating an alternating electric field) into the temperature control roller 112; generating a plasma by means of the sputtering cathode; and atomizing a material (for example a metallic material) of the temperature control roller 112 by means of the plasma, for example for cleaning the temperature control roller 112; optionally exchanging a processing device, the exchange for example including exchanging an evaporation crucible for a sputtering device, the sputtering device using the temperature control roller 112 as a sputtering cathode.

What is claimed is:

1. A temperature control roller, comprising:
   a cylindrical roller shell, which has a multiplicity of gas outlet openings;
   a temperature control device, which is configured to supply thermal energy to and/or extract thermal energy from the roller shell;
   multiple gas lines extending along the axis of rotation;
   a gas distributing structure, which couples the multiple gas lines and the multiplicity of gas outlet openings to one another in a gas-conducting manner, wherein the gas distributing structure has multiple layers, which differ from one another in their structure density,
   the gas distributing structure having a lower structure density and/or greater electrical conductivity than the roller shell.

2. The temperature control roller of claim 1,
   wherein the structure density of the gas distributing structure is defined by gas-conductive openings in the gas distributing structure.

3. The temperature control roller of claim 1,
   the gas distributing structure having a porous layer that defines the structure density of the gas distributing structure.

4. The temperature control roller of claim 1,
   the gas distributing structure having multiple circumferential channels, each circumferential channel of which couples the multiple gas lines to one another in a gas-conducting manner.

5. The temperature control roller of claim 4,
   each circumferential channel of the multiple circumferential channels extend longitudinally around the axis of rotation.

6. The temperature control roller of claim 1,
   the gas distributing structure having a gas distributing layer, which is penetrated by a multiplicity of perforations that define the structure density of the gas distributing structure.

7. The temperature control roller of claim 1,
   the roller shell having a gradient in the structure density, wherein the gradient defines a radially increasing structure density in a direction defined from the axis of rotation to the multiplicity of gas outlet openings of the cylindrical roller shell.

8. The temperature control roller of claim 1,
   the roller shell being dielectric.

9. The temperature control roller of claim 1, the temperature control device having:
   a cylindrical housing, which has a cavity for receiving a temperature control fluid.

10. The temperature control roller of claim 1, further comprising:
    a contacting arrangement, which is connected in an electrically conductive manner to the gas distributing structure for coupling an electrical potential into the gas distributing structure.

11. The temperature control roller of claim 1,
    the gas distributing structure having multiple segments that are electrically insulated from one another and electrically conductive.

12. The temperature control roller of claim 1,
the gas distributing structure having an anisotropic electrical conductivity.

13. The temperature control roller device of claim 1, wherein the structure density comprises a number of gas conducting channels per layer area through which gas may flow from the multiple gas lines to the multiplicity of gas outlet openings.

14. A temperature control roller device, comprising:
a cylindrical roller shell with a plurality of gas outlet openings;
a temperature control device configured to supply thermal energy to and/or extract thermal energy from the roller shell, wherein the temperature control device comprises a cylindrical housing and a cavity within the housing for receiving a temperature control fluid;
a plurality of gas lines extending along the axis of rotation;
a gas distributing structure that couples the plurality of gas lines with the plurality of gas outlet openings in a gas-conducting manner,
wherein the gas distributing structure couples the cylindrical roller shell with the plurality of gas lines,
wherein the gas distributing structure comprises a plurality of stacked layers that differ from one another in their structure density and in their radial distance from the axis of rotation, wherein each layer of the plurality of stacked layers has a layer structure density that is lower than the roller shell, wherein the layer structure density of each layer increases as the function of the radial distance of the layer from the axis of rotation,
wherein the plurality of stacked layers comprises at least one conductive layer that has a greater electrical conductivity than the cylindrical roller shell; and
a contacting arrangement connected in an electrically conductive manner to the at least one conductive layer.

15. The temperature control roller device of claim 14, wherein the plurality of gas outlet openings are defined by a network of interconnected pores and/or a granular material.

16. The temperature control roller device of claim 14, wherein the plurality of stacked layers comprise at least one mesh layer formed from a meshwork of filaments.

17. The temperature control roller device of claim 14, the temperature control roller device further comprising a shaft extending along the axis of rotation and carrying the cylindrical roller shell, wherein the multiple gas lines are within the cylindrical housing that is spatially separated from the shaft.

18. The temperature control roller device of claim 14, wherein the gas distributing structure is arranged between the cavity and the cylindrical roller shell.

19. The temperature control roller device of claim 14, wherein the cylindrical roller shell comprises a dielectric material that provides an electrical breakdown voltage of more than 1000 volts.

20. A temperature control roller device, comprising:
a dielectric cylindrical roller shell with a plurality of gas outlet openings defined by a network of interconnected pores and/or a granular material;
a temperature control device configured to supply thermal energy to and/or extract thermal energy from the dielectric cylindrical roller shell, wherein the temperature control device comprises a cylindrical housing and a cavity within the housing for receiving a temperature control fluid;
a plurality of gas lines extending along the axis of rotation;
a gas distributing structure that couples the plurality of gas lines with the plurality of gas outlet openings in a gas-conducting manner,
wherein the gas distributing structure couples the dielectric cylindrical roller shell with the plurality of gas lines and is arranged between the cavity and the dielectric cylindrical roller shell,
wherein the gas distributing structure comprises a plurality of stacked layers that differ from one another in their structure density and in their radial distance from the axis of rotation, wherein each layer of the plurality of stacked layers has a layer structure density that is lower than the dielectric cylindrical roller shell, wherein the layer structure density of each layer increases as the function of the radial distance of the layer from the axis of rotation,
wherein the plurality of stacked layers comprise at least one mesh layer formed from a meshwork of filaments,
wherein the plurality of stacked layers comprises at least one conductive layer that has a greater electrical conductivity than the dielectric cylindrical roller shell;
a contacting arrangement connected in an electrically conductive manner to the at least one conductive layer; and
a shaft extending along the axis of rotation and carrying the dielectric cylindrical roller shell, wherein the multiple gas lines are within the cylindrical housing that is spatially separated from the shaft.

* * * * *